US010461704B2

(12) United States Patent
Shah et al.

(10) Patent No.: US 10,461,704 B2
(45) Date of Patent: Oct. 29, 2019

(54) SWITCHLESS MULTI INPUT STACKED TRANSISTOR AMPLIFIER TREE STRUCTURE

(71) Applicant: pSemi Corporation, San Diego, CA (US)

(72) Inventors: Khushali Shah, San Diego, CA (US); Haopei Deng, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 15/846,055

(22) Filed: Dec. 18, 2017

(65) Prior Publication Data

US 2019/0190468 A1    Jun. 20, 2019

(51) Int. Cl.
| | | |
|---|---|---|
| *H03F 3/45* | (2006.01) | |
| *H03F 3/193* | (2006.01) | |
| *H01Q 23/00* | (2006.01) | |
| *H03F 1/22* | (2006.01) | |
| *H03F 3/16* | (2006.01) | |

(52) U.S. Cl.
CPC .............. *H03F 3/193* (2013.01); *H01Q 23/00* (2013.01); *H03F 1/22* (2013.01); *H03F 3/16* (2013.01)

(58) Field of Classification Search
CPC ........................................................ H03F 3/45
USPC .......................................... 330/253, 254, 311
See application file for complete search history.

(56) References Cited

U.S. PATENT DOCUMENTS

| | | | |
|---|---|---|---|
| 5,202,645 A * | 4/1993 | Phan ...................... | H03F 1/086 330/253 |
| 6,937,080 B2 * | 8/2005 | Hairapetian ..... | H03K 3/356043 327/210 |
| 7,245,187 B2 * | 7/2007 | Khajehpour .......... | H03F 1/3211 330/253 |
| 7,248,120 B2 | 7/2007 | Burgener et al. | |
| 7,893,765 B2 * | 2/2011 | Litmanen ................ | H03F 3/195 330/253 |
| 8,432,217 B2 * | 4/2013 | Riekki .................. | H03F 1/0277 330/283 |
| 8,987,792 B2 | 3/2015 | Adamski et al. | |
| 9,219,445 B2 | 12/2015 | Nobbe et al. | |
| 9,842,858 B2 | 12/2017 | Willard | |
| 9,882,531 B1 | 1/2018 | Willard et al. | |
| 2011/0037518 A1 * | 2/2011 | Lee .......................... | H03F 1/223 330/253 |
| 2014/0171010 A1 | 6/2014 | Olson | |
| 2014/0184335 A1 | 7/2014 | Nobbe et al. | |
| 2014/0184336 A1 | 7/2014 | Nobbe et al. | |
| 2014/0184337 A1 | 7/2014 | Nobbe et al. | |
| 2015/0270806 A1 | 9/2015 | Wagh et al. | |
| 2017/0141134 A1 | 5/2017 | Willard | |

* cited by examiner

*Primary Examiner* — Henry Choe
(74) *Attorney, Agent, or Firm* — Jaquez Land Greenhaus LLP; Alessandro Steinfl, Esq.

(57) ABSTRACT

Methods and devices for amplifying a plurality of input RF signals based on a multi-input cascode configuration is described. Transistors of stages of the multi-input cascode configuration are connected according to a tree, where there is at least one cascode transistor that is connected to at least two transistors of a stage below. In one case the stage below is an input stage, and in another case the stage below is a cascode stage. Activation and deactivation of transistors of the stages provide different conduction paths between the input stage and an output stage.

21 Claims, 18 Drawing Sheets

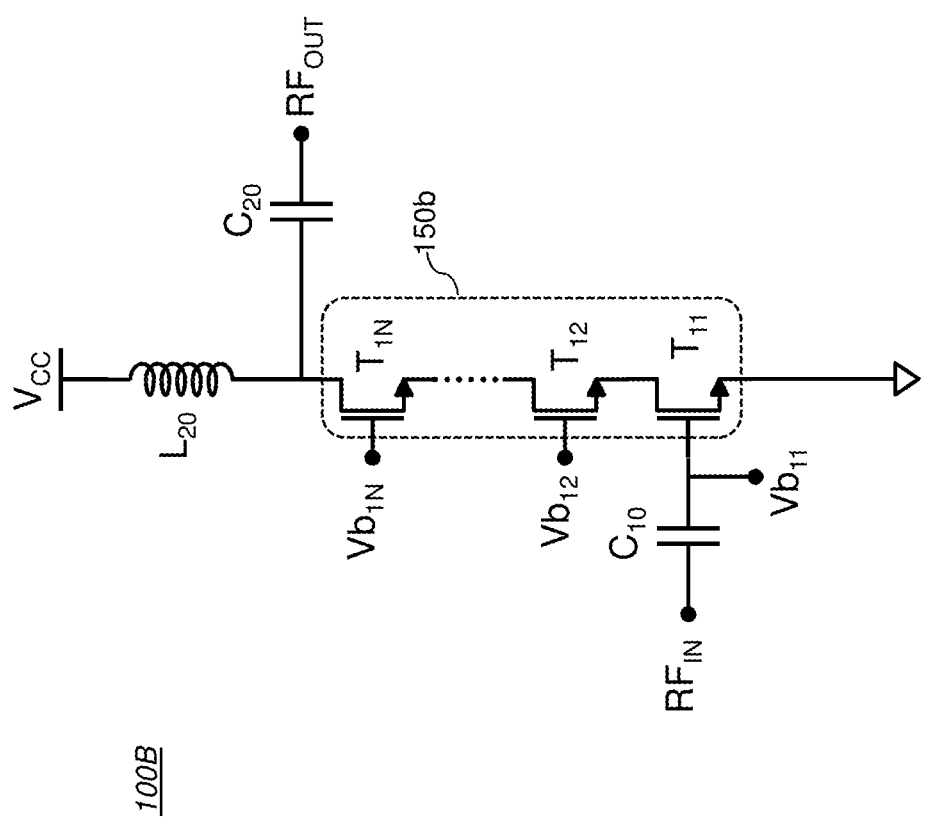
FIG. 1B  *Prior Art*

SWITCHLESS MULTI INPUT STACKED TRANSISTOR AMPLIFIER TREE STRUCTURE

CROSS REFERENCE TO RELATED APPLICATIONS

The present application may be related to U.S. Pat. No. 8,987,792 B2, entitled "Merged Active Devices on a Common Substrate", issued Mar. 24, 2015, the disclosure of which is incorporated herein by reference in its entirety. The present application may also be related to U.S. Pat. No. 7,248,120, issued on Jul. 24, 2007, entitled "Stacked Transistor Method and Apparatus", the disclosure of which is incorporated herein by reference in its entirety. The present application may also be related to Published U.S. Application No. 2015/0270806 A1, published Sep. 24, 2015, entitled "Bias Control for Stacked Transistor Configuration", the disclosure of which is incorporated herein by reference in its entirety. The present application may also be related to U.S. application Ser. No. 15/268,257, entitled "Body Tie Optimization for Stacked Transistor Amplifier", filed on Sep. 16, 2016, the disclosure of which is incorporated herein by reference in its entirety. The present application may also be related to U.S. application Ser. No. 14/945,323, entitled "Butted Body Contact for SOI Transistor", filed on Nov. 18, 2015, the disclosure of which is incorporated herein by reference in its entirety. The present application may also be related to Published U.S. Application No. 2014/0171010 A1, published Jun. 19, 2014, entitled "Semiconductor Devices with Switchable Ground-Body Connection", the disclosure of which is incorporated herein by reference in its entirety. The present application may also be related to U.S. application Ser. No. 15/078,930, entitled "Butted Body Contact for SOI Transistor", filed on Mar. 23, 2016, the disclosure of which is incorporated herein by reference in its entirety. The present application may also be related to Published U.S. Application No. 2014/0184336 A1, published Jul. 3, 2014, entitled "Amplifier Dynamic Bias Adjustment for Envelope Tracking", the disclosure of which is incorporated herein by reference in its entirety. The present application may also be related to U.S. Pat. No. 9,219,445 entitled "Optimization Methods for Amplifiers with Variable Supply Power", issued Dec. 22, 2015, the disclosure of which is incorporated herein by reference in its entirety. The present application may also be related to Published U.S. Application No. 2014/0184335 A1, published Jul. 3, 2014, entitled "Amplifiers Operating in Envelope Tracking Mode or Non-Envelope Tracking Mode", the disclosure of which is incorporated herein by reference in its entirety. The present application may also be related to Published U.S. Application No. 2014/0184337 A1, published Jul. 3, 2014, entitled "Control Systems and Methods for Power Amplifiers Operating in Envelope Tracking Mode", the disclosure of which is incorporated herein by reference in its entirety.

TECHNICAL FIELD

The present teachings relate to RF (radio frequency) circuits. More particularly, the present teachings relate to methods and apparatuses for reducing physical layout size of circuits using multiple stacked transistors amplifier circuits.

BACKGROUND

Radio frequency (RF) devices, such as cell phone receivers, are becoming increasingly complex due to requirements to operate according to different modes of operation associated with, for example, additional frequency bands, more complex modulation schemes, higher modulation bandwidths, and the introduction of data throughput improvement schemes such as simultaneous RF transmission and/or reception within a same or different, but closely spaced, bands or channels within a band (e.g. voice, data), and aggregate reception wherein information is multiplexed over parallel RF transmissions.

In order to support such different modes of operation, use of mode specific amplifiers may be one option, where performance of the amplifier may be tuned according to the specific mode. One well known amplifier configuration is a cascode configuration where a plurality of series connected transistors (stacked transistors) are used to amplify an input RF signal. The above referenced papers, whose disclosures are incorporated herein by reference in their entirety, provide more details on design, manufacturing, operation, biasing, tuning and optimization of such cascode configuration.

As the number of modes increases, use of mode specific amplifiers may become too costly and unpractical. For example, considering the high number of different frequency bands that an RF device, such as a cell phone transmitter and/or receiver, may need to support, the traditional approach of adding band specific narrow band amplifiers for each of the supported frequency bands may be prohibitive due to its high cost and required large physical size.

It is therefore an object of the present disclosure to provide a solution to the traditional approach of using mode specific amplifiers while reducing a performance degradation associated with the provided solution.

SUMMARY

According to a first aspect of the present disclosure, a multi-input cascode amplifier configuration is presented, comprising: an input stage comprising a plurality of input transistors configured to receive a plurality of input RF signals; one or more cascode stages comprising an output stage, wherein the input transistors of the input stage and cascode transistors of the one or more cascode stages are connected according to a tree structure so that at least one cascode transistor of a first cascode stage of the one or more cascode stages is coupled to at least two transistors of a second stage comprising one of: a) the one or more cascode stages, and b) the input stage.

According to a second aspect of the present disclosure, a method for amplifying a plurality of input RF signals according to at least two modes of operation is presented, the method comprising: providing an input stage comprising a plurality of input transistors configured to receive the plurality of input RF signals; providing one or more cascode stages comprising an output stage; connecting the input transistors of the input stage and cascode transistors of the one or more cascode stages; based on the connecting, forming a tree structure so that at least one cascode transistor of a first cascode stage of the one or more cascode stages is coupled to at least two transistors of a second stage comprising one of: a) the one or more cascode stages, and b) the input stage; during a first mode of operation, providing a first conduction path between a first input RF signal of the plurality of input RF signals and the output stage, the first conduction path comprising the at least one cascode transistor of the first stage and one of the at least two transistors of the second stage, thereby amplifying the first input RF signal based on the first conduction path; and during a second mode of operation, providing a second conduction path between a second input RF signal of the plurality of input RF signals and the output stage, the second conduction path comprising the at least one cascode transistor of the first stage and the other of the at least two transistors of the second stage, thereby amplifying the second input RF signal based on the second conduction path.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 1B shows a simplified schematic representation of a prior art RF amplifier using a stack of a plurality (N) series connected transistors arranged in a cascode configuration.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein.

The present disclosure describes electrical circuits in electronics devices (e.g., cell phones, radios) having a plurality of devices, such as for example, transistors (e.g., MOSFETs). Persons skilled in the art will appreciate that such electrical circuits comprising transistors can be arranged as amplifiers.

The term "amplifier" as used in the present disclosure is intended to refer to amplifiers comprising stacked transistors configured as amplifiers, and can be used, for example, as power amplifiers (PAs) and/or low noise amplifiers (LNAs). An amplifier can refer to a device that is configured to amplify a signal input to the device to produce an output signal of greater magnitude than the magnitude of the input signal. Stacked transistor amplifiers, in particular stacked transistor amplifiers operating as a cascode configuration, are described for example in U.S. Pat. No. 7,248,120, issued on Jul. 24, 2007, entitled "Stacked Transistor Method and Apparatus", the disclosure of which is incorporated herein by reference in its entirety. As used herein, the term "amplifier" can also be applicable to amplifier modules and/or power amplifier modules having any number of stages (e.g., pre-driver, driver, final), as known to those skilled in the art.

As used in the present disclosure, the term "mode" can refer to a wireless standard and its attendant modulation and coding scheme or schemes. As different modes may require different modulation schemes, these may affect required channel bandwidth as well as affect the peak-to-average-ratio (PAR), also referred to as peak-to-average-power-ratio (PAPR), as well as other parameters known to the skilled person. Examples of wireless standards include Global System for Mobile Communications (GSM), code division multiple access (CDMA), Worldwide Interoperability for Microwave Access (WiMAX), Long Term Evolution (LTE), as well as other wireless standards identifiable to a person skilled in the art. Examples of modulation and coding schemes include binary phase-shift keying (BPSK), quadrature phase-shift keying (QPSK), quadrature amplitude modulation (QAM), 8-QAM, 64-QAM, as well as other modulation and coding schemes identifiable to a person skilled in the art.

As used in the present disclosure, the terms "channel" and "band" are used interchangeably and can refer to a frequency range. More in particular, the terms "channel" and "band" as used herein refers to a frequency range that can be defined by a wireless standard such as, but not limited to, wideband code division multiple access (WCDMA) and long term evolution (LTE).

Figure 1A:
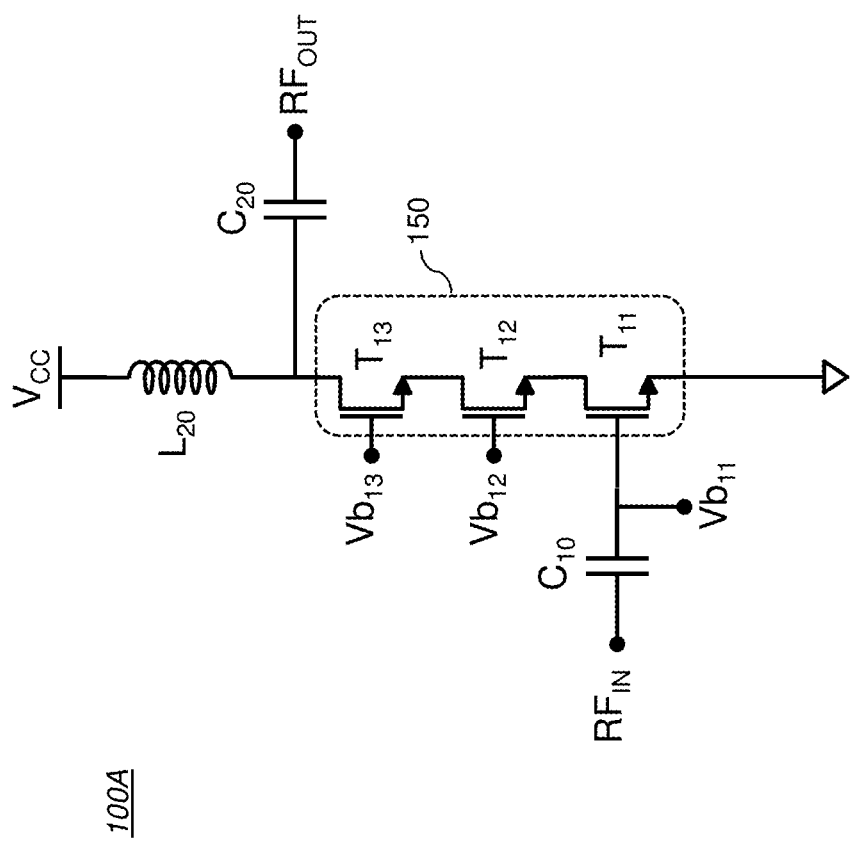
FIG. 1A shows a simplified schematic representation of a prior art RF amplifier using a stack of three series connected transistors arranged in a cascode configuration.

FIG. 1A shows a simplified schematic representation of a prior art RF amplifier (100A) using a stack of three series connected transistors, (T11, T12, T13), arranged in a cascode configuration. As can be seen in FIG. 1A the RF amplifier (100A) comprises an active core (150) comprising an input transistor, T11, an output transistor, T13, and an intermediate transistor, T12, where transistors (T12, T13) are the cascode transistors of the cascode configuration used in the RF amplifier (100A). Such RF amplifier (100A) using a stack configuration is well known to a person skilled in the art and widely discussed in the above references whose disclosures are incorporated herein by reference in their entirety. In particular, the person skilled in the art is well aware of a principle of operation of the cascode configuration shown in FIG. 1A, which is beyond the scope of the present disclosure.

With continued reference to FIG. 1A, an input RF, $RF_{IN}$, provided at a gate terminal of the input transistor T11 of the amplifier (100A) through a coupling capacitor, C10, is amplified by the amplifier (100A). A corresponding amplified output RF signal, $RF_{OUT}$, is provided at a drain of the output transistor, T13, and routed to an output terminal of the amplifier through a coupling capacitor, C20. Coupling capacitors C10 and C20 can be used to decouple low frequency (e.g., DC) biasing voltages provided to the stack of transistors (transistor stack) from the $RF_{IN}$ and $RF_{OUT}$ signals. A supply voltage, $V_{CC}$, is provided to the drain of the output transistor, T13, through an inductor, L20, and a reference voltage (e.g., GND) is connected to a source of the input transistor T11. The supply voltage $V_{CC}$ may be fixed or variable. Biasing voltages at nodes ($Vb_{11}, Vb_{12}, Vb_{13}$) are provided to respective gates of the stacked transistors (T11, T12, T13). Such biasing voltages may be used to bias respective transistors according to desired operating conditions (e.g. points), or even to completely deactivate (i.e. substantially no current conduction) the respective transistors in cases, for example, where the amplifier (100A) is not used (e.g. standby mode of operation). Various biasing circuits to generate such biasing voltages to the RF amplifier (100A) are described, for example, in the above referenced U.S. Pat. Nos. 9,219,445, 8,487,706 B2, to Published U.S. Application No. 2014/0184335 A1, Published U.S. Application No. 2014/0184336 A1, Published U.S. Application No. 2014/0184337 A1, and Published U.S. Application No. 2015/0270806.

With further reference to FIG. 1A, as used herein, each of the transistors T11, T12 and T13 of the amplifier (100A) define one stage of the active core (150), where transistor T11 defines an input stage, transistor T12 defines an intermediate stage, and transistor T13 defines an output stage. It would be clear to a person skilled in the art that each of the stages of the amplifier (100A) comprises a single transistor. It would also be clear to a person skilled in the art that the intermediate stage and the output stage can be referred to as cascode stages, as they include cascode transistors of the cascode configuration of the amplifier (100A). Finally, as can be seen in FIG. 1A, each transistor of each of the two cascode stages is coupled, via its source node, to exactly one transistor (e.g. drain node of such transistor) at a lower stage, the lower stage being the intermediate cascode stage when considering the transistor T13 of the output cascode stage, and the input stage when considering the transistor T12 of the intermediate cascode stage.

FIG. 1B shows a simplified schematic representation of a prior art RF amplifier (100B) using a stack of a plurality (N) series connected transistors (T11, . . . , T1N) arranged in a cascode configuration. Principle of operation of the configuration (100B) is similar to one described above with respect to the configuration (100A) of FIG. 1A. A person skilled in the art would understand that a larger stack height of the active core (150b), defined by the integer number N, where N=2, 3, 4, . . . , 8, . . . , can allow for a larger voltage at the drain of the output transistor, T1N, as such voltage can be distributed among the N stacked transistors of the active core (150b). Distribution of the voltage at the drain of the output transistor, T1N, can in turn limit a voltage across any two nodes (source, drain, gate) of a transistor of the active core (150b) to within a safe operating range (e.g. within a withstand voltage of the transistors).

Figure 1C:
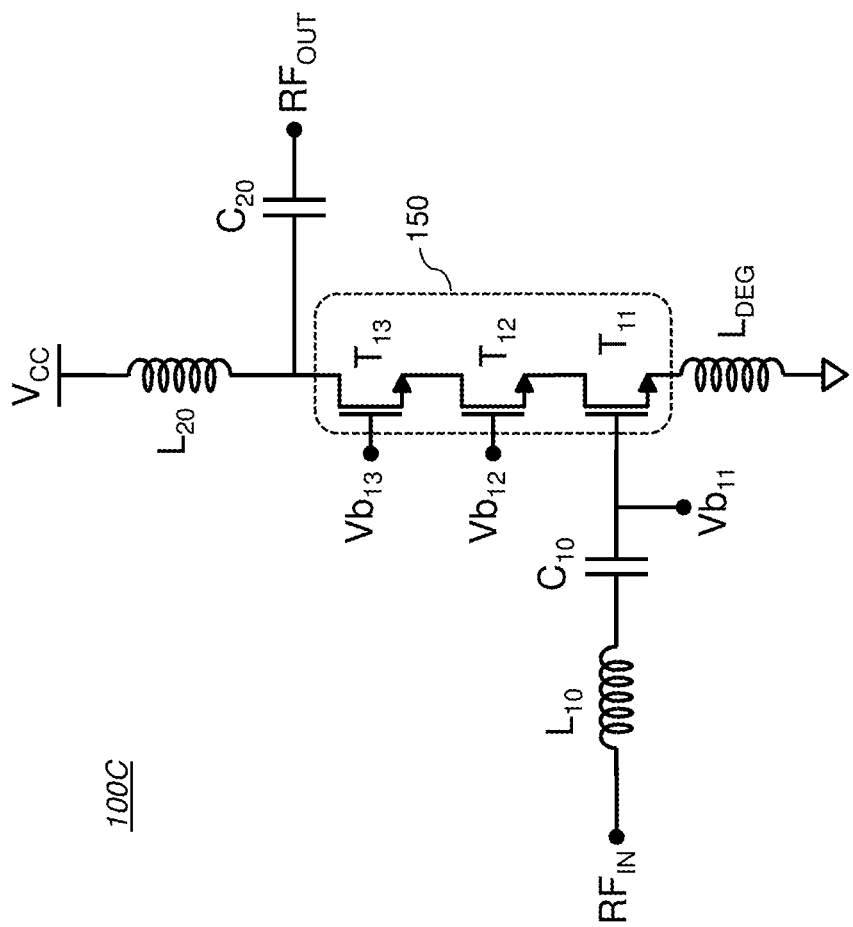
FIG. 1C shows a simplified schematic representation of a prior art common source degenerated amplifier configuration.
Figure 2A:
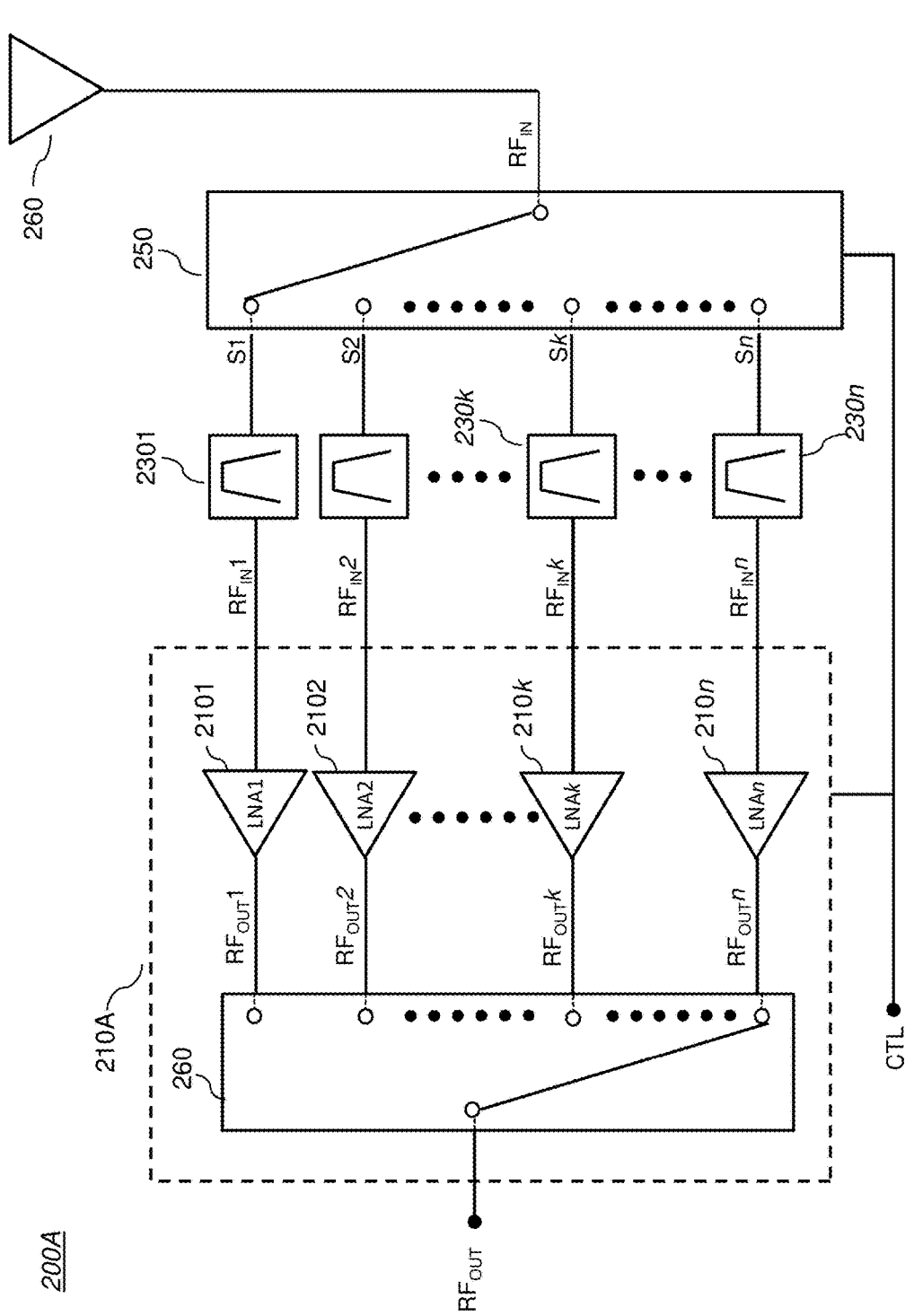
FIG. 2A shows a block diagram of receive paths of a prior art multi-mode RF front-end stage of an RF device, as used, for example, in a cellular phone, where band specific low noise amplifiers (LNAs) are used for each receive path to support the multi-mode operation.
Figure 2B:
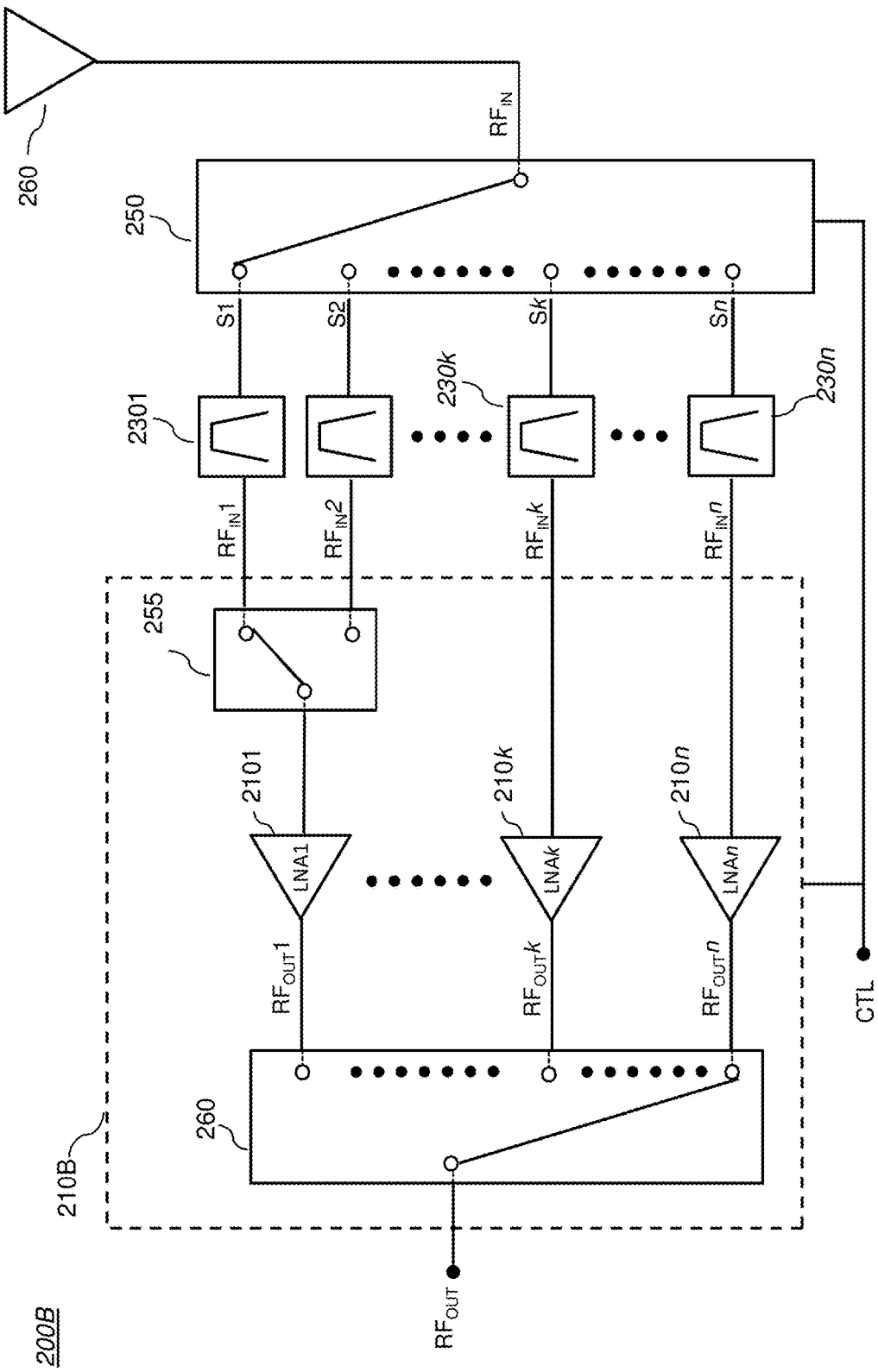
FIG. 2B shows a block diagram of receive paths of a prior art multi-mode RF front-end stage of an RF device similar to one shown in FIG. 2B, with the difference that two receive paths share a same (wideband) LNA to receive different bands signals.

FIG. 1C shows a simplified schematic representation of an exemplary prior art common source degenerated amplifier configuration (100C). Such exemplary configuration uses the amplifier (100A) with coupling of the source node of the input transistor, T11, to ground via a degeneration inductor, $L_{DEG}$, and coupling of the input RF signal, $RF_{IN}$, to the coupling capacitor, C10, via an input inductor, L10. A person skilled in the art is well aware of such configuration and associated benefits, including benefits for input impedance matching as well as for a linearity performance and noise figure performance of the amplifier configuration (100C). In particular, such benefits make the configuration (100C) a design choice for implementations of, for example, low noise amplifiers (LNAs) used, for example, in receive paths of an RF system as depicted in FIG. 2A and FIG. 2B, later described. It should be noted that a number of stacked transistors in the active core (150) of the configuration (100C) can be N, as provided in the active core (150b) shown in FIG. 1B, in dependence, for example, of a maximum voltage at the drain node of the output transistor (e.g. T13).

FIG. 2A shows a simplified block diagram of a prior art RF front-end stage (200A) which can be used for RF reception of multiple modes and multiple frequency bands signals via an antenna (260). A person skilled in the art would realize that the block diagram depicted in FIG. 2A may also include transmit paths (not shown) coupled to antenna (260) for RF transmission of the multiple modes and multiple frequency band signals via the same antenna (260).

As can be seen in FIG. 2A, an antenna switch (250) may be used to switch an input RF signal, $RF_{IN}$, detected at the antenna, (260), to one of a plurality of selectable receive paths, each comprising, for example, a filter (2301, . . . , 230n) and a low noise amplifier, LNA, (2101, . . . , 210n), where each of the plurality of selectable receive paths processes the detected $RF_{IN}$ signal according to a corresponding mode and/or band of operation. An output processed by each of the receive paths can be selectively routed for downstream processing (e.g. via a transceiver, not shown) by way of an output switch (260). Control of the antenna switch (250) and the output switch (260) through control signal, CTL, may be provided via a controller that is aware of a selected mode and/or band of operation of the RF front-end stage (200A), such as, for example, a transceiver unit (not shown).

In the exemplary setting of the antenna switch (250) shown in FIG. 2A, the detected RF signal, $RF_{IN}$, is routed through the antenna switch (250), to a receive path comprising a filter, (2301) and a low noise amplifier, (2101), for processing of the RF signal, $RF_{IN}$, and output as $RF_{OUT}$ signal via the output switch (260). As known to a person skilled in the art, the filter (2301) may comprise a narrow band filter that is part of a duplexer unit (not shown) of the RF front-end stage (200A). Also, as known to a person skilled in the art, and discussed above, each low noise amplifier (2101, . . . , 210n) may be, for example, an amplifier according to the common source degenerated amplifier configuration (100C) shown in FIG. 1C.

Figure 2C:
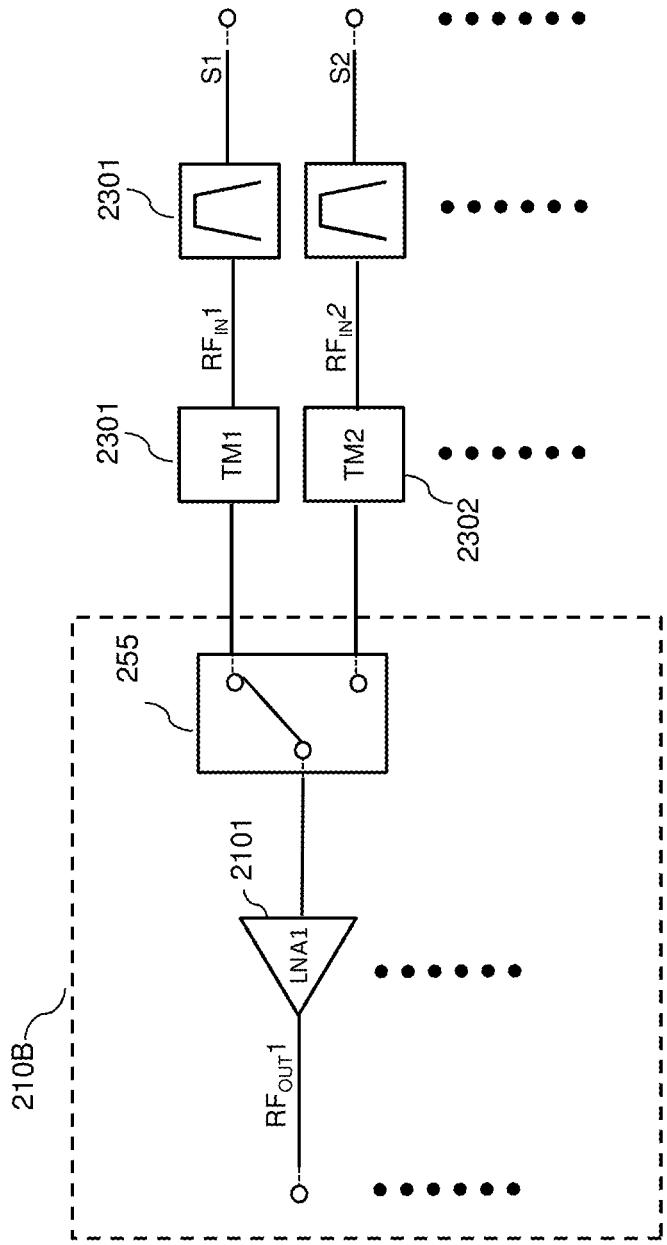
FIG. 2C shows implementation details of exemplary matching circuits coupled to the input of the same (wideband) LNA of FIG. 2B.

In some cases, it may be desirable to share a single low noise amplifier, LNA, among two or more receive paths as shown in the simplified block diagram of the prior art RF front-end stage (200B) of FIG. 2B. In such case, a switch (255) selectively couples two or more (e.g. 2301, 2302) of the filters (2301, . . . , 230n) to an input of a single low noise amplifier, LNA, (2101). In such configuration, it may be desirable that the shared LNA (2101) supports a wider band frequency of operation including frequency bands as determined by the selectively coupled two or more filters (e.g. 2301, 2302). A person skilled in the art readily knows that in some cases, it may be advantageous and/or required to use a band-specific (impedance) matching circuit between an input of a low noise amplifier (2101, . . . , 210n) and an output of a corresponding filter (2301, . . . , 230n) as shown in FIG. 2C. In the specific case where such matching circuit is to be provided between the input of the LNA (2101) of FIG. 2B and the output of the two filters (2301, 2302), as shown in FIG. 2C, two band-specific matching circuits (TM1, TM2) may be coupled, each, between a filter of the two filters (2301, 2302) and a corresponding input terminal of the switch (255) to which the filter is coupled. In other words, the matching circuits (TM1, TM2) are coupled to the input of the LNA (2101) through the switch (255). This may make matching more difficult due to a capacitance of the switch (255) when in the open state (e.g. non-conducting), and a series impedance of the switch when in the closed state (e.g. conducting). A person skilled in the art would clearly understand that a match directly (connected) at the input of the LNA (2101) may provide better matching results.

As discussed above, as larger number of modes and/or bands are to be supported, a physical layout size of the block (e.g. 210A, 210B) of the RF front-end stage (e.g. 200A, 200B of FIGS. 2A, 2B)) may become larger due to a larger number of active cores (e.g. 150 of FIG. 1C) and potentially to a larger number of degeneration inductors (e.g. $L_{DEG}$ of FIG. 1C). As described below, such larger physical layout size may be reduced according to the various embodiments of the present disclosure described below, including i) use of a multi-input cascode configuration having a plurality of stages (an input stage having multiple inputs for receiving multiple input signals, and one or more cascode stages), wherein at least one cascode stage has a plurality of transistors, and wherein at least one transistor of a cascode stage is coupled, via its source node, to drain nodes of at least two transistors of a stage immediately below, and ii) sharing of one degeneration inductor among a plurality of input transistors of the multi-input cascode configuration. Such multi-input configuration according to the present disclosure removes requirement for a selection switch, such as the switch (255) of FIG. 2B, and therefore allows for direct coupling of the matching circuit discussed above to a corresponding input of the multiple inputs for a better matching performance.

Figure 3A:
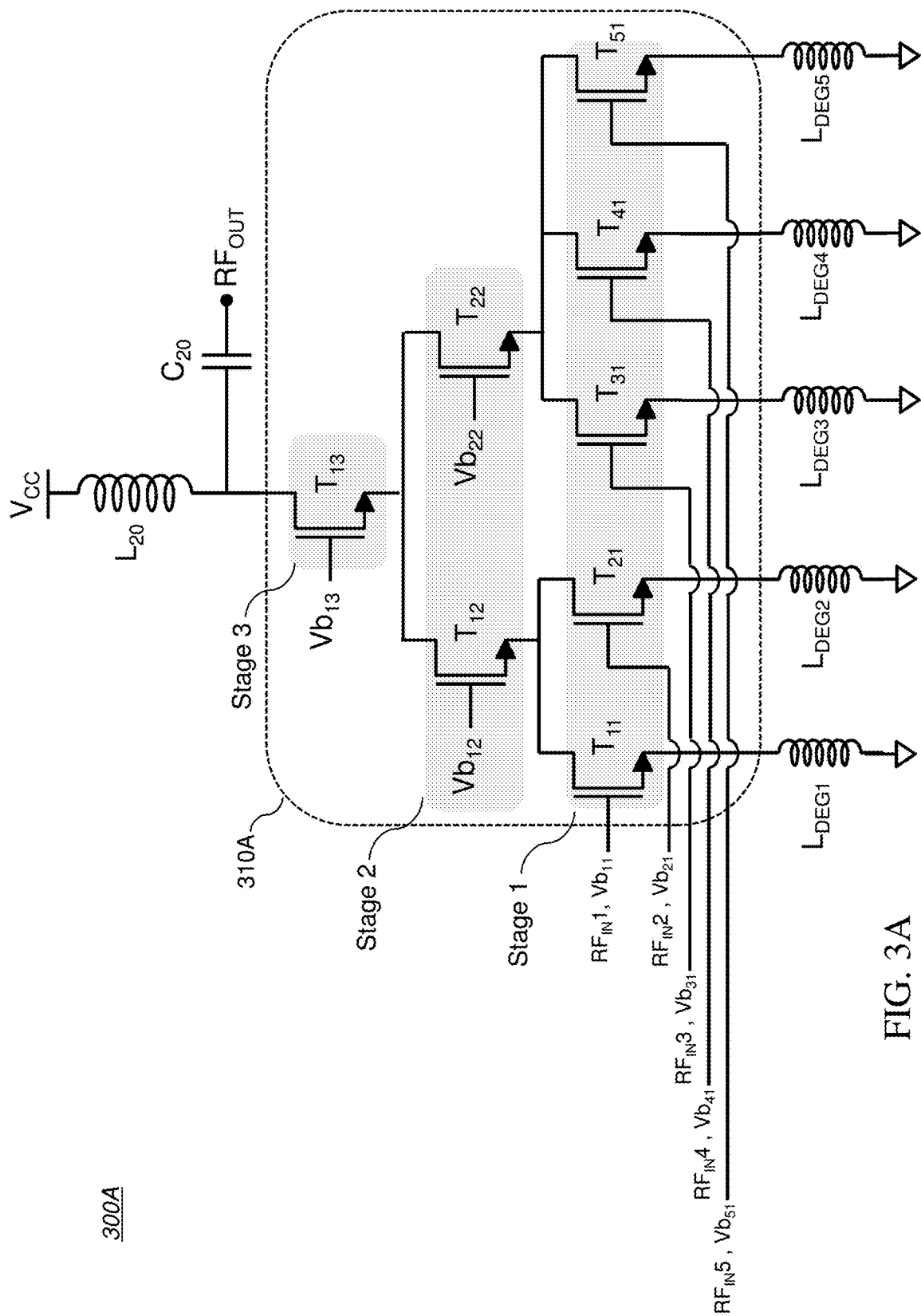
FIG. 3A shows a simplified schematic representation, according to an exemplary embodiment of the present disclosure, of a multi-input cascode configuration where at least one cascode transistor of a cascode stage is coupled to at least two transistors of a lower stage.

FIG. 3A shows a simplified schematic representation, according to an embodiment of the present disclosure, of an exemplary multi-input cascode configuration (300A), wherein at least one cascode transistor of a cascode stage is coupled to at least two transistors of a lower stage. As can be seen in FIG. 3A, the multi-input cascode configuration (300A) comprises an active core (310A) having a plurality of stages, including: an input stage, Stage 1, having input transistors (T11, T21, T31, T41, T51), an intermediate cascode stage, Stage 2, having intermediate cascode transistors (T12, T22), and an output cascode stage, Stage 3, having a single output transistor, T13. In general, transistors of a multi-input cascode configuration according to the present disclosure, as depicted in the exemplary configuration of FIG. 3A, are identified by two indices, (p,k), such as, $T_{(p,k)}$, or $T_{p,k}$, or $T_{pk}$, where k indicates a stage of a plurality of stages of the configuration where the transistor belongs to, and p indicates an order (e.g. random order) of the transistor in the stage k. In a case where the configuration contains N stages, then $T_{p,1}$ represents a transistor of the input stage, $T_{p,N}$ represents a transistor of the output (cascode) stage, and $T_{p,m}$, with m=(2, . . . , N−1), represents a transistor of an intermediate cascode stage, Stage m.

With continued reference to the multi-input cascode configuration (300A) of FIG. 3A, the input transistors (T11, T21, T31, T41, T51) of the input stage, Stage 1, are each configured to receive a respective input RF signal ($RF_{IN1}$, $RF_{IN2}$, $RF_{IN3}$, $RF_{IN4}$, $RF_{IN5}$) and be biased via a respective biasing voltage ($Vb_{11}$, $Vb_{21}$, $Vb_{31}$, $Vb_{41}$, $Vb_{51}$). Coupling of an input RF signal and biasing voltage to each input transistor may be, for example, according to any one scheme described/depicted in relation to the prior art configurations of FIGS. 1A, 1B and 1C. In particular, in a case where a common source degenerated configuration is desired, then each input transistor (T11, T21, T31, T41, T51) may be coupled to a respective input RF signal via a respective input inductor (e.g. L10 of FIG. 1C), and coupled to a reference ground through a respective degeneration inductor (e.g. $L_{DEG1}$, . . . , $L_{DEG5}$ depicted in FIG. 3A).

With further reference to the multi-input cascode configuration (300A) of FIG. 3A, each stage, (Stage 1, Stage 2, Stage 3), of the active core (310A) comprises one or more transistors, and transistors of different stages are interconnected via a tree structure, according to teachings of the present disclosure, that provides a distinct conduction path between each of the input transistors (T11, T21, T31, T41, T51) and the output transistor, T13. The tree structure according to the teachings of the present disclosure is characterized in that at least one (cascode) transistor of a cascode stage (e.g. Stage 2 and Stage 3 in FIG. 3A) is connected via its source node, to at least two transistors of a stage immediately below (e.g. Stage 1 and Stage 2 in FIG. 3A). For example, as can be seen in FIG. 3A, output transistor, T13 of the cascode (output) Stage 3, is connected through its source node to drain nodes of intermediate transistors T12 and T22 of the cascode Stage 2, and each of the intermediate transistors T12 and T22 of the cascode Stage 2 is connected through its source node, to drain nodes of input transistors (T11, T21) and (T31, T41, T51) of the input Stage 1. As a result of the provided tree structure, a conduction path between the input transistor, T11, and the output transistor, T13, passes through an intermediate transistor, T12, to effectively provide a conduction path comprising activated transistors (T11, T12, T13). Other conduction paths between each of the input transistors T21, T31, T41, T51 and the output transistor T13 respectively comprise (T21, T12, T13), (T31, T22, T13), (T41, T22, T13), and (T51, T22, T13).

With continued reference to FIG. 3A, by disabling conduction (e.g. deactivating) of transistors not included in a conduction path of a respective input transistor to the output transistor, T13, an input signal provided at the respective input transistor is effectively amplified through a cascode configuration provided by the (activated) transistors in the conduction path. For example, if transistors (T11, T12, T13) are activated (via corresponding biasing voltages, to provide a conduction path for a current), and if all other transistors are deactivated (via corresponding biasing voltages, to conduct no current or substantially no current), then the input RF signal, $RF_{IN1}$, is amplified by way of a cascode configuration comprising input transistor, T11, of the input stage, Stage 1, output cascode transistor, T13, of the output stage, Stage 3, and intermediate cascode transistor, T12, of the intermediate stage, Stage 2. Biasing conditions of the activated transistors (T11, T12, T13) provided via biasing voltages ($Vb_{11}$, $Vb_{12}$, $Vb_{13}$) can be used to provide a desired performance of the cascode configuration, for example, as related to a mode and/or band of operation of the $RF_{IN1}$ signal. In other words, stages (Stage 1, Stage 2, Stage 3) of the configuration according to the present disclosure exemplified in FIG. 3A comprise banks of transistors which may be selectively activated and deactivated to provide different cascode configurations, wherein the different cascode configurations may be used to process RF signals according to different modes and/or bands, by way, for example, of different biasing conditions provided to the activated transistors. As described above, activation and deactivation of the transistors, as well as biasing conditions, may be provided by way of corresponding biasing voltages.

With continued reference to the multi-input cascode configuration (300A) of FIG. 3A, a person skilled in the art would appreciate the advantages provided by the innovative tree structure which allows provision of a different cascode configuration for each of the different input RF signals ($RF_{IN1}$, $RF_{IN2}$, $RF_{IN3}$, $RF_{IN4}$, $RF_{IN5}$) with a reduced size of a total active core (310A) and minimum impact on performance. Such reduced size of the active core (310A) is provided by "sharing" of one or more cascode transistors of the cascode stages (stages different from the input stage) among the different cascode configurations. For example, with reference to FIG. 3A, the output Stage 3 comprises a single transistor T13 which is shared among all five possible cascode configurations, the intermediate Stage 2 comprises two transistors T12 and T22, where T12 is shared among two different cascode configurations and T22 is shared among three different cascode configurations. Such sharing of one or more transistors among a plurality of different cascode configurations allows for the reduction in number of transistors of the active core (310A) and therefore of a corresponding reduction in physical size of a layout of the configuration (300). When compared, for example, to the known prior art configuration depicted in FIG. 2A, which uses an active core that is part of the block (210A) comprising distinct amplifiers (2101, . . . , 210n), such as amplifiers depicted in FIGS. 1A-1B, for a five-input configuration, a ratio of a size of the active core (310A) using eight active devices (transistors) to a size of the active core of the block (210A) using fifteen, 3×5=15, active devices, is 8/15, or close to 53%. Similarly, a reduction in size may also be obtained when compared to the active core (210B) of the configuration depicted in FIG. 2B. The reduced number of active devices (transistors) provided by the configuration according to the present teachings may also reduce a size of circuitry needed to provide biasing to the active devices.

Figure 3B:
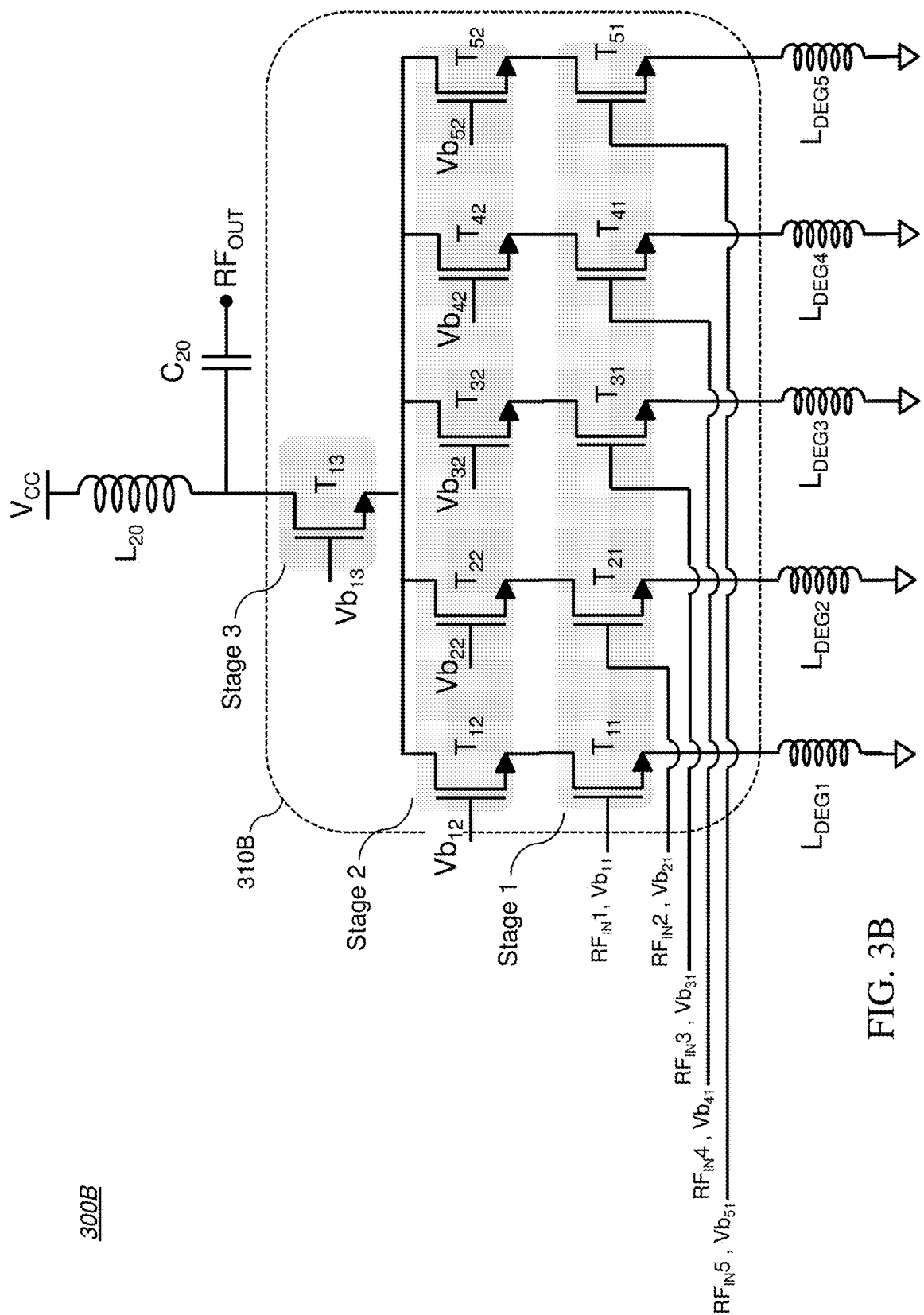
FIG. 3B shows a simplified schematic representation, according to another exemplary embodiment of the present disclosure, of a multi-input cascode configuration where at least one cascode transistor of a cascode stage is coupled to at least two transistors of a lower stage.

FIG. 3B shows a simplified schematic representation, according to an embodiment of the present disclosure, of an exemplary multi-input cascode configuration (300B), wherein at least one cascode transistor, T13, of a cascode stage, Stage 3, is coupled to at least two transistors, (T12, . . . , T52), of a lower stage, Stage 2. Principle of operation of such configuration is similar to one of the configuration (300A) discussed above in relation to FIG. 3A, but with a different tree structure that interconnects transistors of different stages. In particular, as can be seen in FIG. 3B, only the single transistor T13 of the output stage, 3, has a connection, via its source node, to at least two different transistors of Stage, 2, that is immediately below the Stage 3 to which the transistor T13 belongs. In other words, the only transistor that is shared among the different cascode configurations provided by the multi-input cascode configuration (300B) is the output transistor, T13.

A person skilled in the art would realize that a performance of a cascode configuration of the different cascode configurations provided by the multi-input cascode configuration (e.g., 300A of FIG. 3A, 300B of FIG. 3B) may be impacted by a capacitive load seen at the source node of the output transistor, T13. Therefore, coupling the source node of the output transistor T13 to different transistors of a lower stage, Stage 2, may affect capacitive load seen at the source node of the output transistor T13, as the coupled transistors in their OFF states (when deactivated) present a capacitive load. The higher the number of coupled transistors, the larger the capacitive load may become, and therefore the larger the impact on a performance of the cascode configuration may become. For example, considering the configuration (300B) of FIG. 3B, the output transistor, T13, is coupled to all five transistors of the intermediate stage, Stage 2, and therefore, assuming all transistors of a stage are of a same type (e.g. size, technology, etc.), then for any given cascode configuration provided by one active transistor of each of the three stages, (Stage 1, Stage 2, Stage 3), the output transistor, T13, sees four capacitive loads corresponding to the four deactivated transistors of the intermediate Stage 2. In contrast, considering the configuration (300A) of FIG. 3A, the output transistor, T13, sees only one capacitive load, and therefore may provide an increased performance with respect to the configuration (300B) depicted in FIG. 3B. Performance in this context may be related to a linearity response and/or frequency response of a cascode configuration provided by one active transistor of each of the stages. It should be noted that depending on a frequency of operation of the input RF signals, capacitive load presented to the source node of the output transistor, T13, discussed above, may not substantially affect the performance.

Figure 3C:
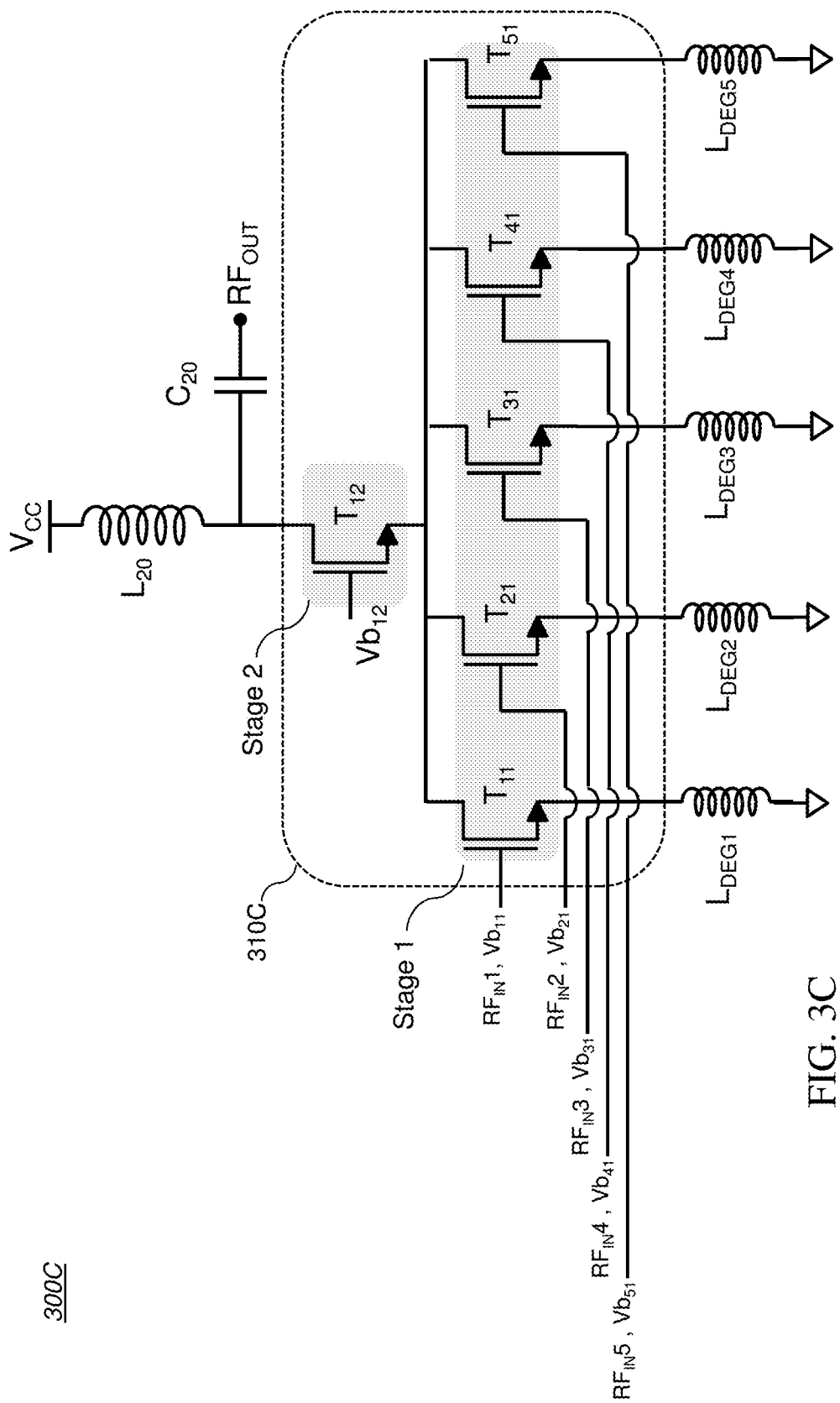
FIG. 3C shows a simplified schematic representation, according to yet another exemplary embodiment of the present disclosure, of a multi-input cascode configuration where at least one cascode transistor of an output cascode stage is coupled to at least two transistors of an input stage.

FIG. 3C shows a simplified schematic representation, according to an embodiment of the present disclosure, of an exemplary multi-input cascode configuration (300C), wherein at least one cascode transistor, T12, of a cascode stage, Stage 2, is coupled to at least two transistors, (T11, . . . , T51), of a lower stage, Stage 1. Principle of operation of such configuration is similar to one of the configurations (300A) and (300B) discussed above in relation to FIG. 3A and FIG. 3B, but with a different tree structure that interconnects transistors of two stages, as opposed to the three stages provided in the above configurations. In particular, as can be seen in FIG. 3C, only the single transistor T12 of the output stage, Stage 2, has a connection, via its source node, to at least two different transistors of a stage, Stage 1, that is immediately below the stage to which the transistor T12 belongs to. In other words, the only transistor that is shared among the different cascode configurations provided by the multi-input cascode configuration (300C) is the output (cascode) transistor, T12. A person skilled in the art would realize that freedom of choice of a tree structure connecting transistors of the different stages of the multi-input cascode configuration according to the present teachings may be reduced based on a number of available stages. For example, the configuration (300C) shows the only possible tree structure given the reduced number of stages and the number of transistors (e.g. single transistor) in the output stage, Stage 2. Also, as discussed above, the number of available stages may be based on a voltage withstand capability of the transistors used in the different stages and expected high voltage at the output of the cascode configuration (as the high voltage distributes over the different stages). Finally, the tree structure may be further based on a desired performance of each of the different cascode configurations provided by the multi-input cascode configuration according to the present teachings.

With further reference to FIGS. 3A-3C, a person skilled in the art would realize that sharing of transistors of upper stages among the different cascode configurations described may influence isolation between input RF signals ($RF_{IN1}$, $RF_{IN2}$, $RF_{IN3}$, $RF_{IN4}$, $RF_{IN5}$), where generally, sharing of a transistor that is part of a stage further from the input stage, Stage 1 may provide for a better isolation than sharing of a transistor that is part of a stage closer to the input stage, Stage 1. For example, FIG. 3A shows any input RF signal of the sets ($RF_{IN1}$, $RF_{IN2}$) and ($RF_{IN3}$, $RF_{IN4}$, $RF_{IN5}$) is isolated from any other input RF signal of the same set via one stage of transistors (T11, T21) and (T31, T41, T51) respectively. On the other hand, and with reference to FIG. 3B, any input RF signal of the set ($RF_{IN1}$, $RF_{IN2}$, $RF_{IN3}$, $RF_{IN4}$, $RF_{IN5}$) is isolated from any other input RF signal of the same set via transistors of two stages (T11, T21, T31, T41, T51) and (T12, T22, T32, T42, T52). It follows that according to an embodiment of the present disclosure, isolation between input RF signals ($RF_{IN1}$, $RF_{IN2}$, $RF_{IN3}$, $RF_{IN4}$, $RF_{IN5}$) may be controlled by the provided tree structure of multi-input cascode configuration (e.g. 300A-300C of FIGS. 3A-3C). In some cases, the tree structure may be according to more or less sensitive bands to isolation, where the more sensitive bands may include shared transistors at further away stages from the input stage, Stage 1, and the less sensitive bands may include shared transistors at stages closer to the input stage, Stage 1.

Figure 4A:
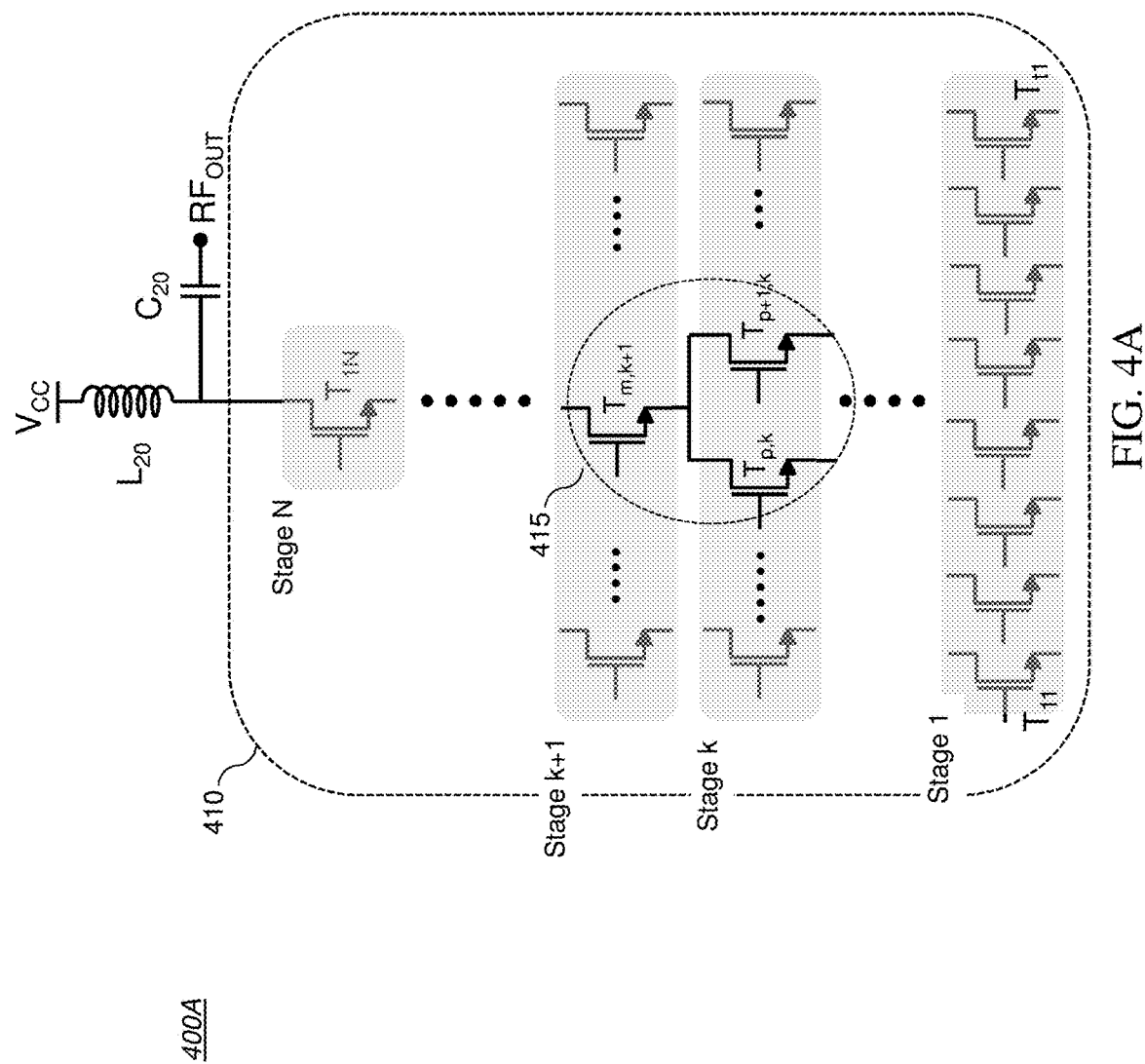
FIG. 4A shows a simplified schematic representation, according to an embodiment of the present disclosure, of a multi-input cascode configuration having an input stage, an output cascode stage that comprises a single output cascode transistor, and one or more intermediate cascode stages, where at least one cascode transistor of a cascode stage is coupled to at least two transistors of a lower stage.

FIG. 4A shows a simplified schematic representation, according to an embodiment of the present disclosure, of a multi-input cascode configuration (400A) having a number N of stages, where N can be any integer number equal to or larger than 2, comprising: an input stage, Stage 1, that comprises a plurality (t) of input transistors, (T11, . . . , Tt1), an output cascode stage, Stage N, that comprises a single output cascode transistor, T1N, and one or more intermediate cascode stages, Stage 2, . . . , Stage k, Stage k+1, . . . , Stage N−1, each comprising one or more cascode transistors, wherein, as shown in the structure (415), at least one cascode transistor, Tm,k+1, of a cascode stage, Stage k+1, is coupled to at least two transistors, Tp,k, Tp+1,k, of a lower stage, Stage k. A person skilled in the art would realize that the configuration (400A) represents a generic configuration based on the configurations (300A, 300B, 300C) discussed above, where a provided tree structure is characterized by inclusion of the structure (415) according to the present teachings, where the transistor Tm,k+1 is shared among two conduction paths; one passing through the transistor Tp,k and one through the transistor Tp+1,k. As described above, a number of input transistors in the input stage, Stage 1, may be based on a number of desired different signal conduction paths to the output transistor, T1N, though the configuration (400A). A number of stages may be based on a desired high voltage at the drain of the output transistor, T1N, and on a voltage withstand capability of the (cascode) transistors used in the configuration (400A). A number of transistors in the one or more cascode stages (output stage, intermediate stages) may be based on a desired tree structure of the configuration (400A), or in other words, on a number of shared transistors and a number of associated connections of the shared transistors to transistors of the stage below.

Figure 4B:
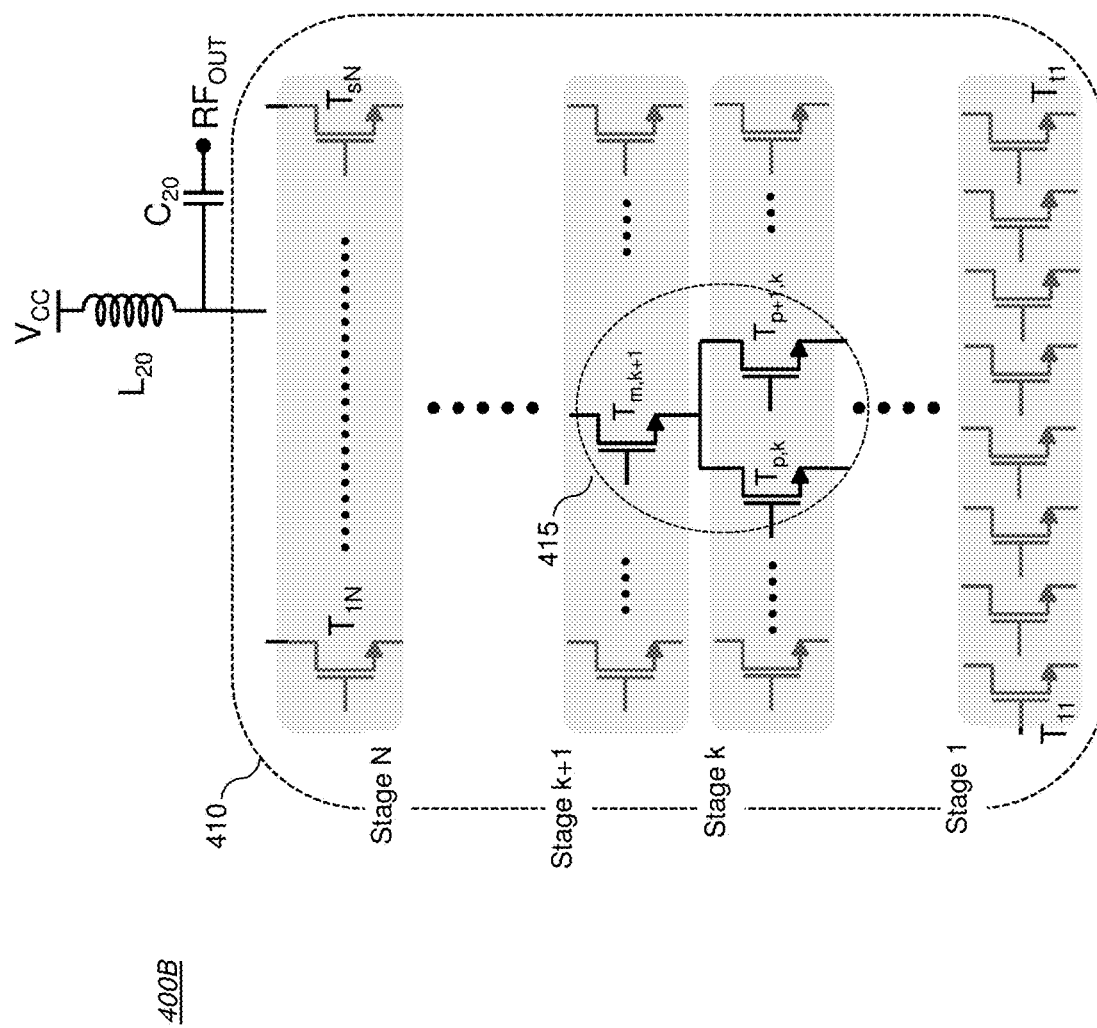
FIG. 4B shows a simplified schematic representation, according to an embodiment of the present disclosure, of a multi-input cascode configuration having an input stage, an output cascode stage, and one or more intermediate cascode stages, where at least one cascode transistor of a cascode stage is coupled to at least two transistors of a lower stage.

FIG. 4B shows a simplified schematic representation, according to an embodiment of the present disclosure, of a multi-input cascode configuration (400B) having a number N of stages, where N can be any integer number equal to or larger than 2, comprising: an input stage, Stage 1, that comprises a plurality (t) of input transistors, (T11, . . . , Tt1), an output cascode stage, Stage N, that comprises a plurality (s) of output cascode transistors, T1N, TsN, and one or more intermediate cascode stages, Stage 2, . . . , Stage k, Stage k+1, . . . , Stage N−1, each comprising one or more cascode transistors, wherein, as shown in the structure (415), at least one cascode transistor, Tm,k+1, of a cascode stage, Stage k+1, is coupled to at least two transistors, Tp,k, Tp+1,k, of a lower stage, Stage k. A person skilled in the art would realize that the configuration (400B) is based on the configuration (400A) described above with reference to FIG. 4A, with the difference that the output stage, Stage N, of the configuration (400B), comprises more than one output transistor. By virtue of having more than one output transistor, the configuration shown in FIG. 4B can allow for two or more separate cascode configurations activated at a same time, and whose outputs are combined at a common drain node of the output stage, Stage N, connected to the inductor L20. According to some embodiments of the present disclosure, such two or more separate cascode configurations may share no transistor, or at least one transistor, in any of the stages, Stage 1, . . . , Stage N−1.

Figure 5A:
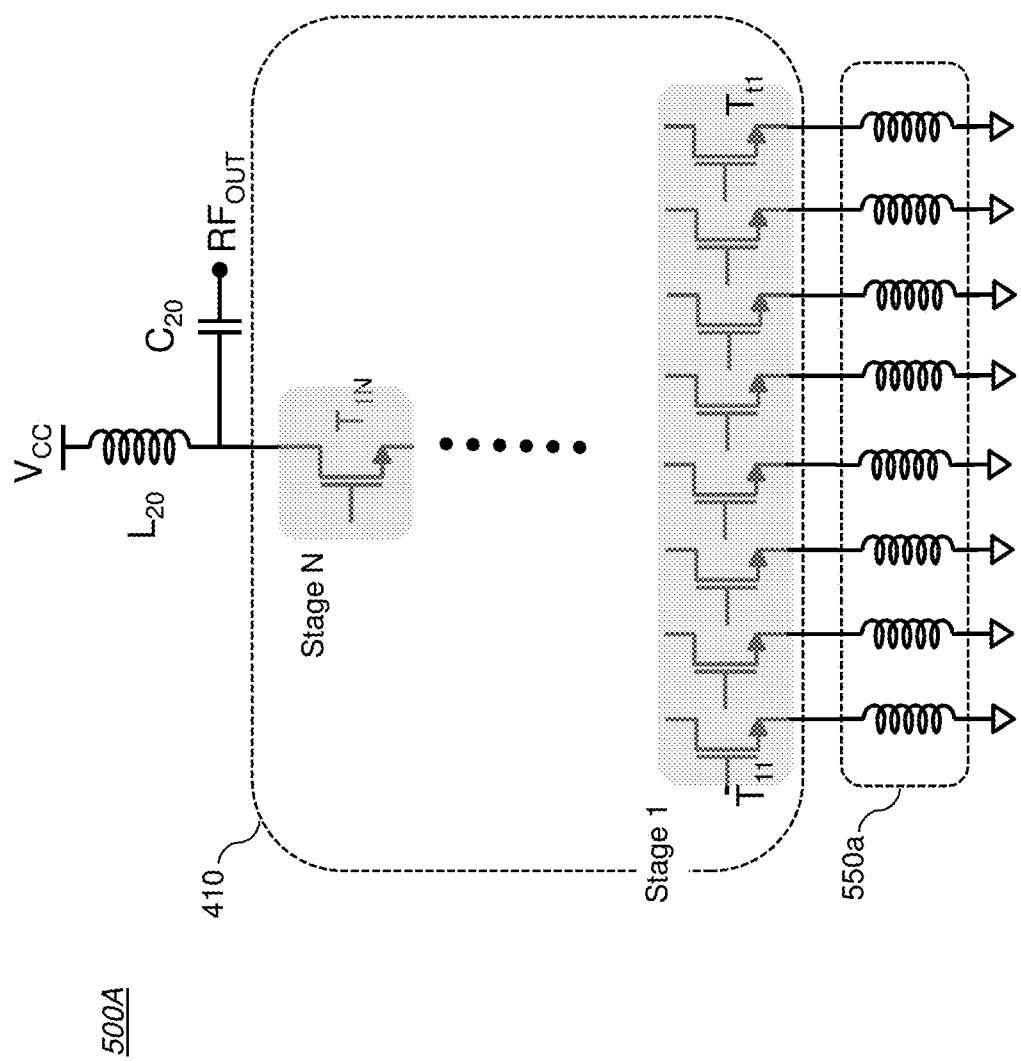
FIG. 5A shows a simplified schematic representation, according to an embodiment of the present disclosure, of a multi-input common source degenerated amplifier configuration using the multi-input cascode configuration shown in FIG. 4A, where each input transistor of the input stage has a dedicated degeneration inductor.

FIG. 5A shows a simplified schematic representation, according to an embodiment of the present disclosure, of a multi-input common source degenerated amplifier configuration (500A) using the multi-input cascode configuration according to the present disclosure described above, where each input transistor, (T11, . . . , Tt1), of the input stage, Stage 1, has a dedicated degeneration inductor, (550a). More details in a coupling of each input transistor, (T11, . . . , Tt1), of the input stage, Stage 1, can be found, for example, in FIG. 1C described above. In conjunction with the different conduction paths provided by the tree structure of the active core (410) as described above, different common source degenerated amplifier configurations, similar to the configuration depicted in FIG. 1C, can be provided by the configuration (500A), where one or more of the different configurations share at least one cascode transistor, per the structure (415) depicted in FIGS. 4A and 4B.

Figure 5B:
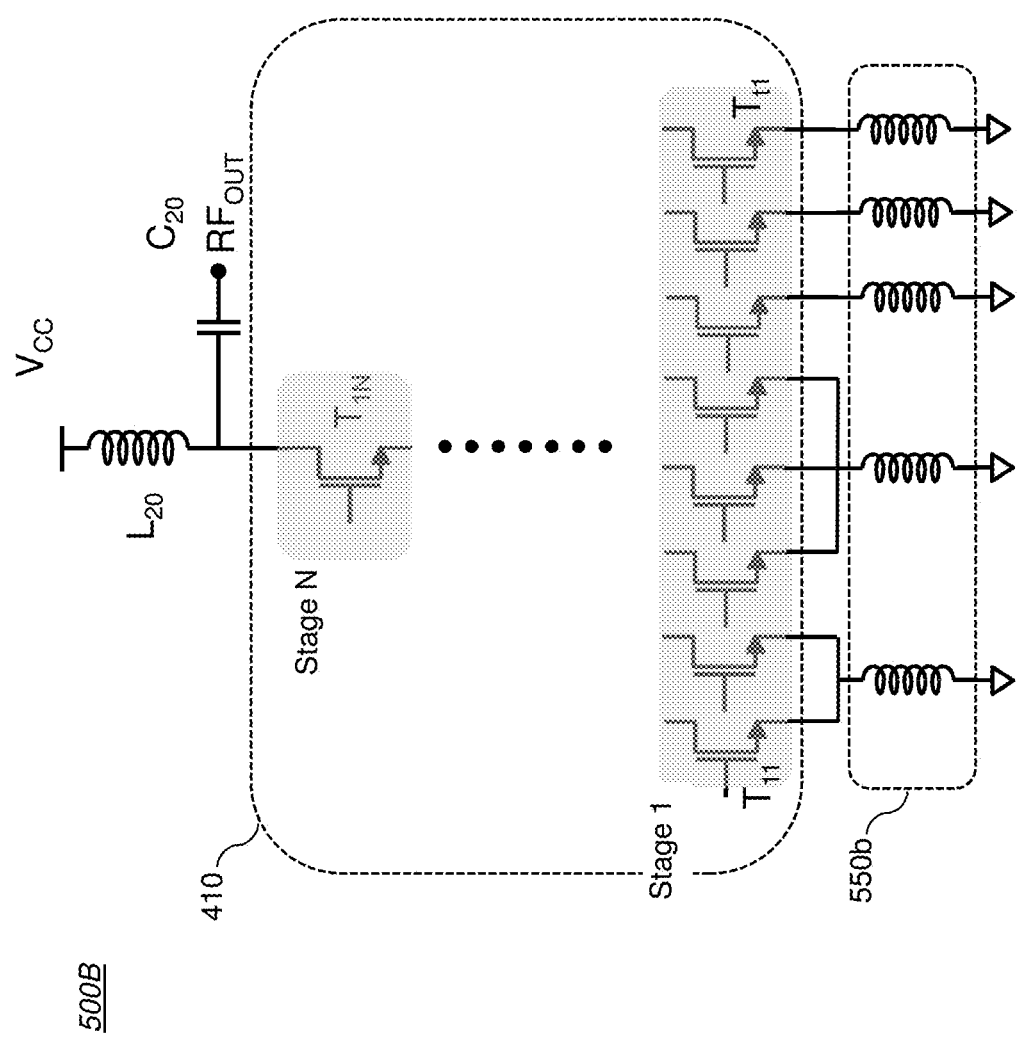
FIG. 5B shows a simplified schematic representation, according to an embodiment of the present disclosure, of a multi-input common source degenerated amplifier configuration using the multi-input cascode configuration shown in FIG. 4A, where a plurality of input transistors of the input stage share one degeneration inductor.

A person skilled in the art realizes the benefits of a degenerated amplifier configuration, but also understands a relatively large physical layout size of corresponding degeneration inductors (e.g. 550a of FIG. 5A). It follows that according to an embodiment of the present disclosure, one or more input transistors of a multi-input common source degenerated amplifier using the multi-input cascode configuration according to the present teachings can share a same degeneration inductor, as shown in FIG. 5B, with minimal impact on performance (e.g. input impedance matching, noise figure, gain, linearity, etc.). According to the exemplary embodiment depicted in FIG. 5B, the first two input transistors share a same degeneration inductor, the third to fifth transistors also share a same degeneration inductor. Teachings according to the present disclosure provide the flexibility on such sharing of a same degeneration inductor for a reduced physical layout size of the configuration (500B). As value, and therefore physical size, of a degeneration inductor may depend on a frequency band of operation, it may be desirable to share the degeneration inductors among transistors (T11, ..., Tt1) of the input stage that operate over different bands that are close in frequency so to maintain a reduced physical size of the shared inductors.

Figure 6:
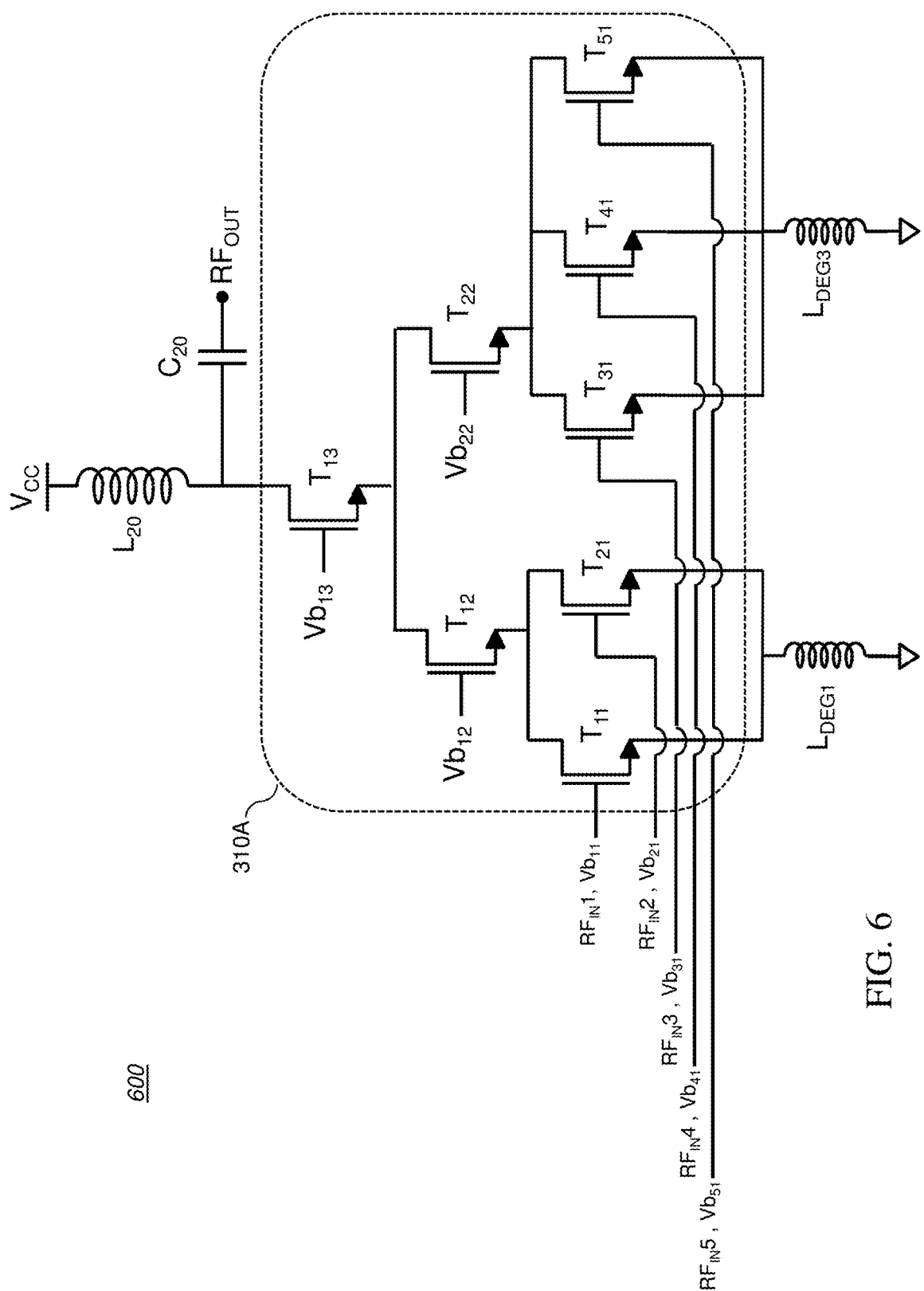
FIG. 6 shows a simplified schematic representation, according to an embodiment of the present disclosure, of a multi-input common source degenerated amplifier configuration using the multi-input cascode configuration shown in FIG. 3A, where a plurality of input transistors of the input stage share one degeneration inductor.

FIG. 6 shows an exemplary implementation of a three stage, multi-input common source degenerated amplifier configuration (600) based on the configuration (500B) of FIG. 5B. As shown in FIG. 6, the configuration (600) comprises the active core (310A) depicted in FIG. 3A and described above, the active core (310) comprising three stages: an input stage that comprises input transistors (T11, T21, T31, T41, T51), an output (cascode) stage that comprises a single output transistor, T13, and an intermediate (cascode) stage that comprises cascode transistors, T12 and T13. More description on the tree configuration provided by the active core (310) can be found in the above description of the FIG. 3A. As shown in FIG. 6, input transistors (T11, T21) share a same degeneration inductor $L_{DEG1}$, and input transistors (T31, T41, T51) share a same degeneration inductor $L_{DEG2}$, to provide a reduced physical layout size of the configuration (600) when compared to the configuration (300A) of FIG. 3A.

According to an exemplary embodiment of the present disclosure, the configuration (600) can be used as a multi-input low noise amplifier (LNA) having a tree structure according to the present teachings discussed above, in, for example, a multi-mode RF front-end similar to one described above with reference to FIG. 2A or FIG. 2B. In such implementation, each of the five different conduction paths between each of the input transistors (T11, ..., T51) and the output transistor, T13, can be used for processing of an input RF signal ($RF_{IN1}$, $RF_{IN2}$, $RF_{IN3}$, $RF_{IN4}$, $RF_{IN5}$) of a different receive band (i.e. different frequency of the input RF signal).

A person skilled in the art readily knows that a plurality of RF amplifiers, such as, for example, any one of the RF amplifiers depicted in FIG. 1A, FIG. 1B and FIG. 1C, can be arranged in parallel (coupled inputs and coupled outputs of the RF amplifiers) to provide an increased gain of the parallel arrangement. According to an embodiment of the present disclosure, same concept can be applied to the multi-input cascode configuration of the present teachings, as depicted in FIG. 7A.

Figure 7A:
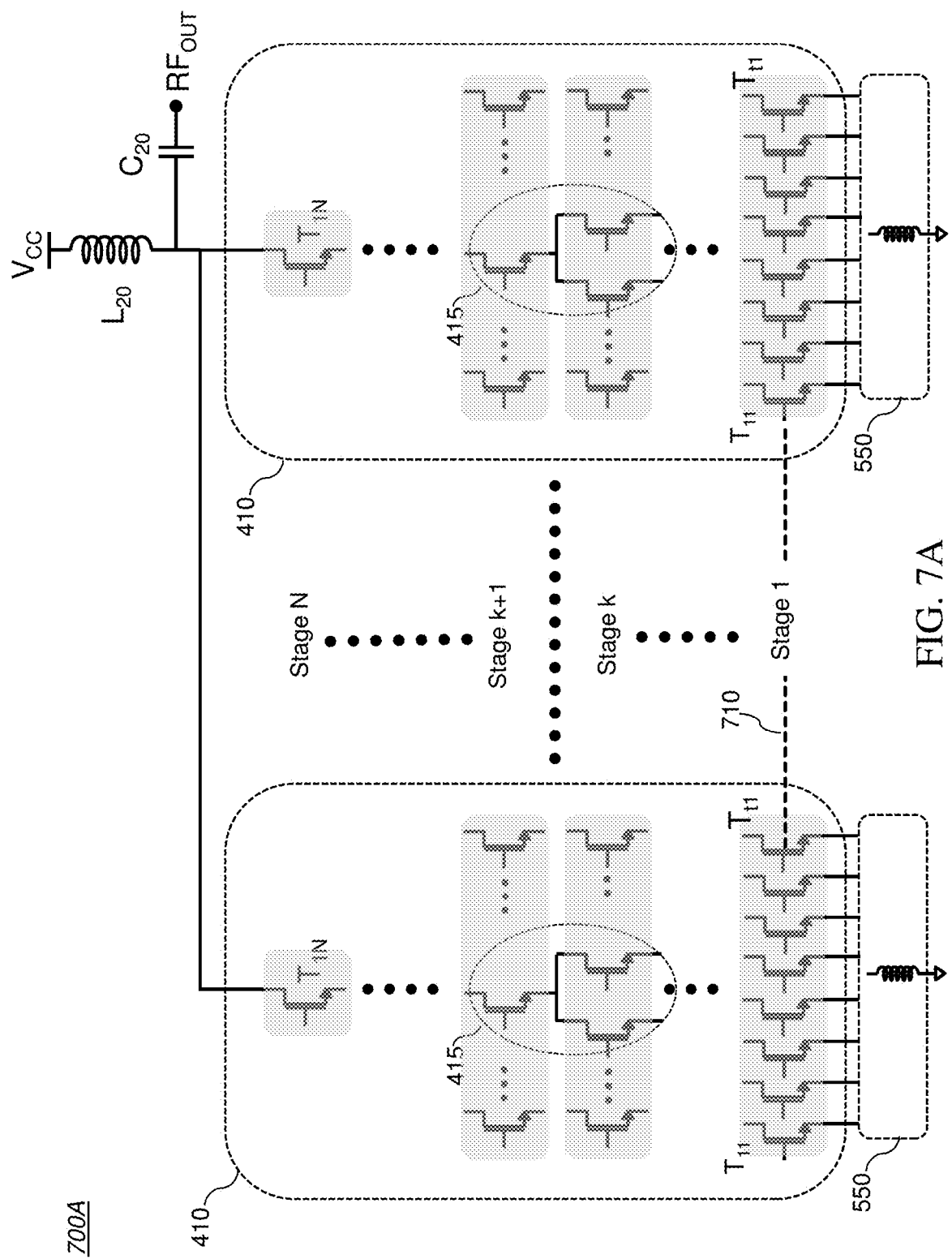
FIG. 7A shows a simplified schematic representation, according to an embodiment of the present disclosure, of an arrangement comprising a plurality of multi-input cascode configurations that are arranged in parallel.

With further reference to FIG. 7A, an arrangement (700A) is presented, comprising a plurality of multi-input cascode configurations (410, 550) that are arranged according to a parallel configuration to provide a selectable increased gain of the arrangement (700A). In such configuration, all the output transistors, T1N, are coupled to one another via their respective drain nodes, and all input transistors (T11, ..., Tt1) associated to a same input RF signal are coupled to one another via their respective gate nodes. Such coupling of the input transistors is represented in FIG. 7A by the dotted line (710), to indicate that all T11 input transistors are coupled to one another via their gate nodes to receive a same input RF signal, $RF_{IN1}$, all T21 input transistors are coupled to one another via their gate nodes to receive a same input RF signal, $RF_{IN2}$, ..., and all Tt1 input transistors are coupled to one another via their gate nodes to receive a same input RF signal, $RF_{INt}$.

Figure 7B:
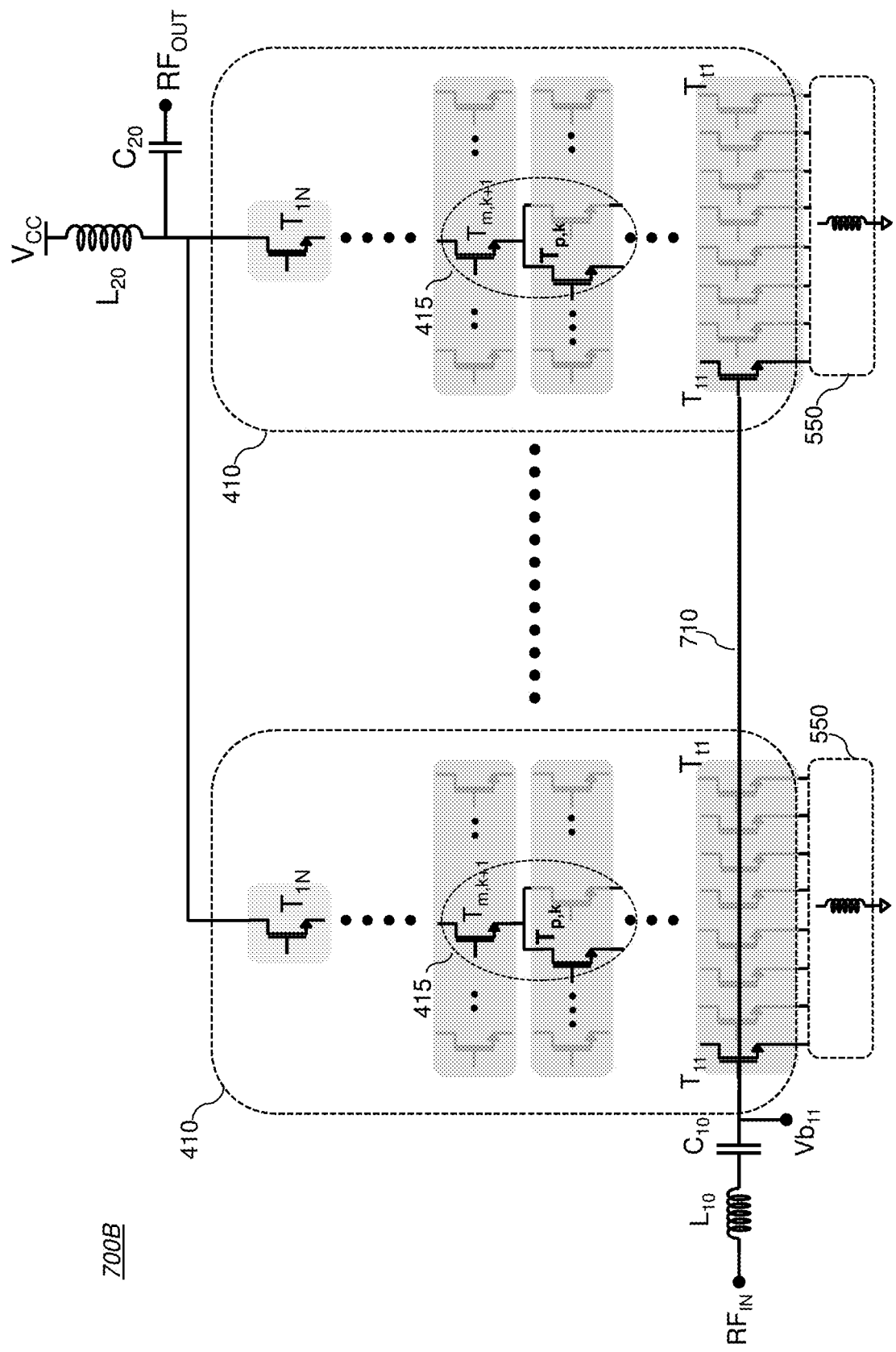
FIG. 7B shows specific current conduction paths for each of the plurality of multi-input cascode configurations of FIG. 7A for conducting a same input RF signal.
Figure 7C:
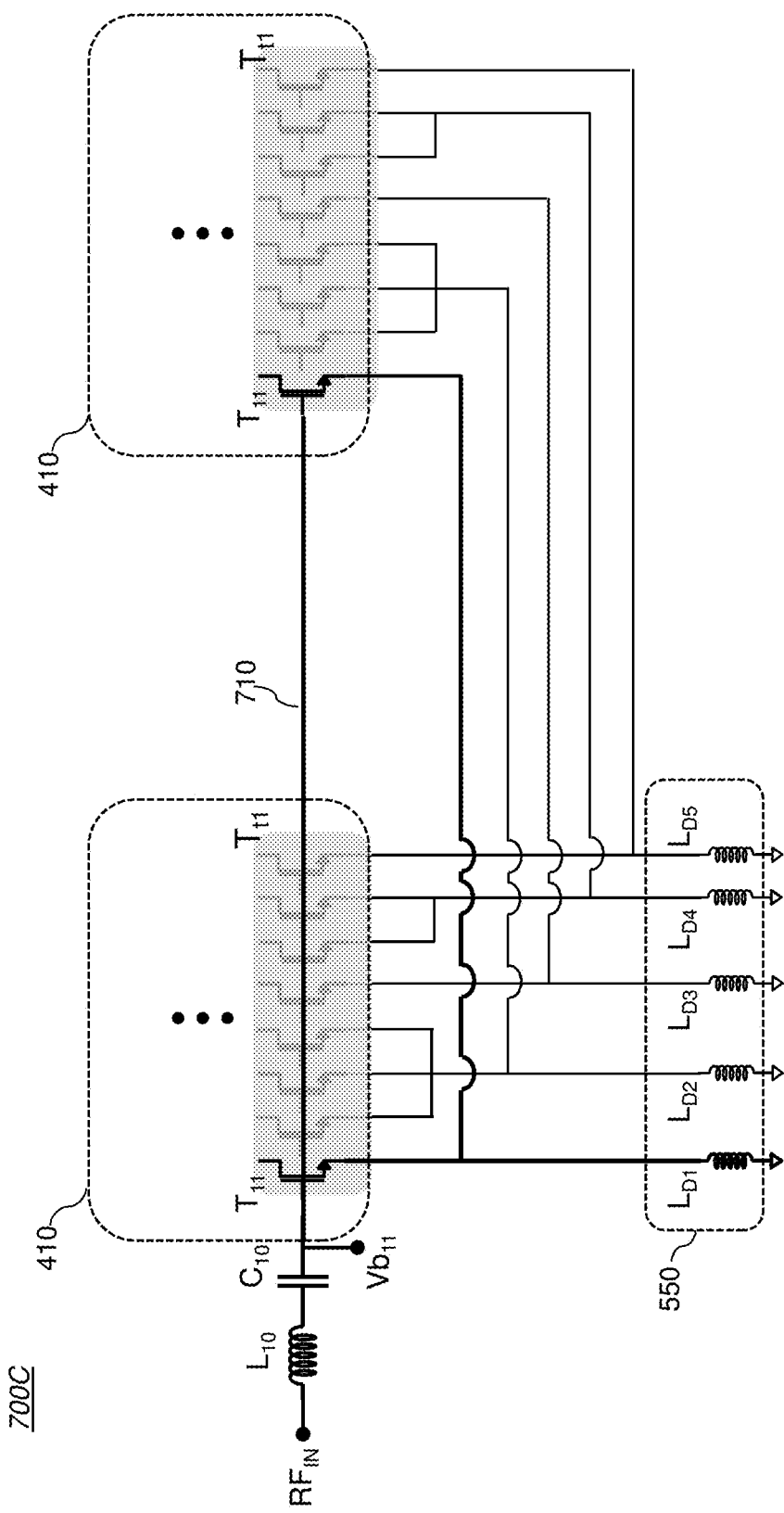
FIG. 7C shows an exemplary coupling of input stage transistors of the of the multi-input cascode configuration of FIG. 7A to degeneration inductors.

Although the exemplary configuration of FIG. 7A shows separate degeneration inductors (550) for each of the active cores (410), according to further exemplary embodiments of the present disclosure, the degeneration inductors (550) can be shared by a plurality of active cores (410), as shown in FIG. 7C. As can be seen in FIG. 7C, input transistors (T11, ..., Tt1) associated to a same input RF signal are coupled to one another via their respective gate and source node. Accordingly, common source nodes of the input transistors (T11, ..., Tt1) can be coupled to a same degeneration inductor (550). For example, per the configuration shown in FIG. 7C, all T1k transistors are coupled to degeneration induction $L_{D1}$, all (T2k-T4k) transistors are coupled to degeneration induction $L_{D2}$, ..., and all Ttk transistors are coupled to degeneration induction $L_{D5}$. As can be seen in FIG. 7C, a same degeneration inductor may also be shared among several common source nodes, as shown for degeneration inductors $L_{D2}$ and $L_{D4}$. A person skilled in the art would clearly understand that many variations of coupling of the input stage transistors (T11, ..., Tt1) of the plurality of multi-input cascode configurations depicted in FIG. 7A may be possible, by i) sharing or not of degeneration inductors within a same multi-input cascode configuration, and ii) sharing or not of degeneration inductors among input transistors with coupled (connected) gates.

FIG. 7B shows specific current conduction paths for each of the plurality of multi-input cascode configurations (410, 500) depicted in FIG. 7A, comprising (highlighted) parallel conduction paths of each of the multi-input cascode configurations (410, 500), where each parallel conduction path comprises (highlighted) transistors (T11, Tp,k, Tm,k+1, ..., T1N). Furthermore, as shown in highlight, all input transistors, T11, are connected to the input RF signal, $RF_{IN1}$, through the coupling capacitor, C10, and the input inductor, L10. A person skilled in the art would recognize that any, all, or none, of the parallel conduction paths (T11, Tp,k, Tm,k+1, ..., T1N) of the plurality of multi-input cascode configurations (410, 500) may be selectively activated to provide a selectable gain of the input RF signal at the output, $RF_{OUT}$. As described above, conduction paths provided by tree structures of active cores (410) of the multi-input cascode configurations (410, 500) may be activated/deactivated via biasing voltages provided to the transistors of the tree structures. Although FIG. 7B describes conduction paths for the input RF signal, $RF_{IN1}$, same principle of operation can be provided with respect to an input RF signal coupled to any of the input transistors (T11, ..., Tt1).

Figure 8:
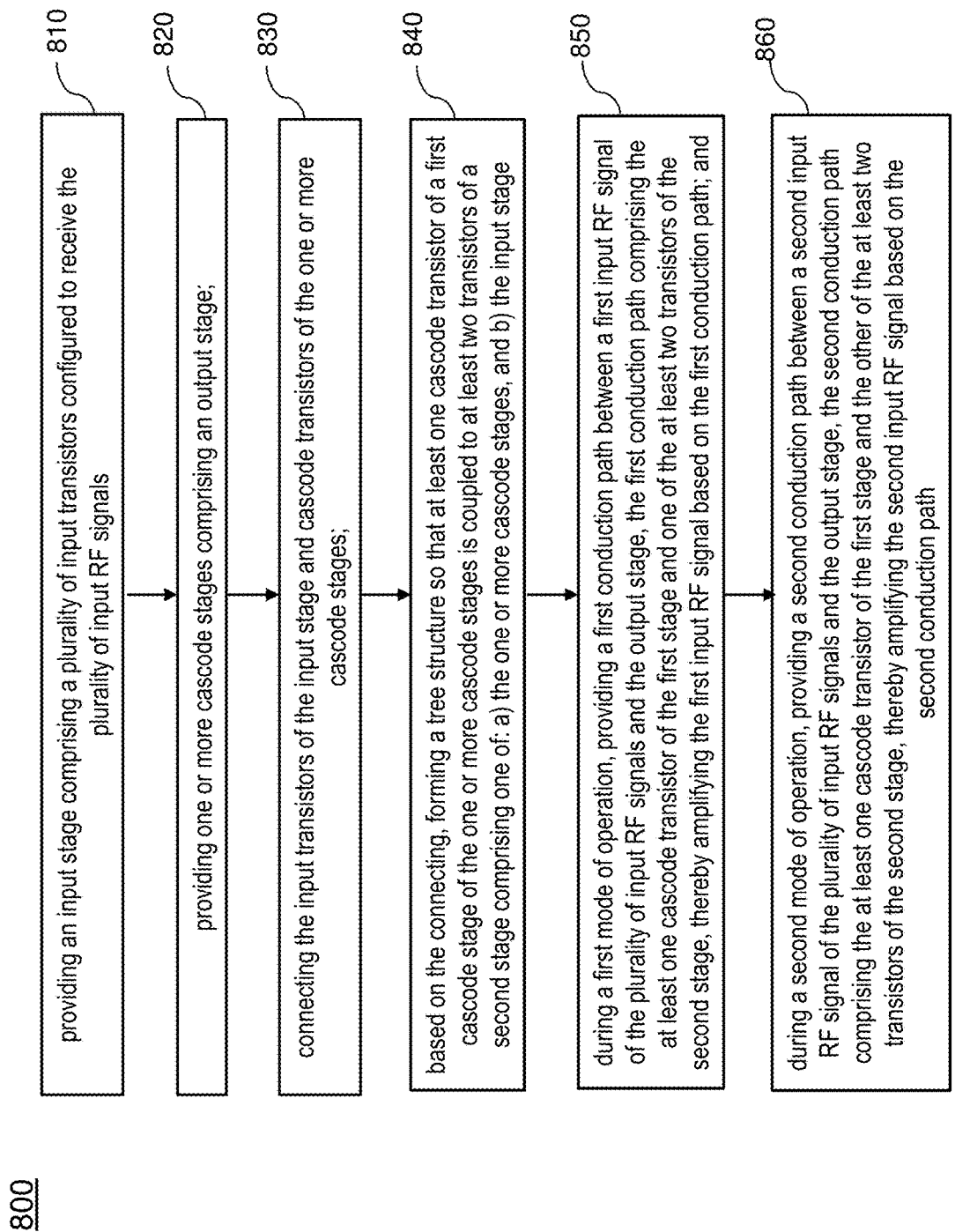
FIG. 8 is a process chart showing a method for amplifying a plurality of input RF signals using a multi-input cascode configuration.

FIG. 8 is a process chart (800) showing various steps of a method for amplifying a plurality of input RF signals according to at least two modes of operation using the multi-input cascode configuration discussed above. As can be seen in the process chart (800), the method comprises: providing an input stage comprising a plurality of input transistors configured to receive the plurality of input RF signals, per step (810); providing one or more cascode stages comprising an output stage, per step (820); connecting the input transistors of the input stage and cascode transistors of the one or more cascode stages, per step (830); based on the connecting, forming a tree structure so that at least one cascode transistor of a first cascode stage of the one or more cascode stages is coupled to at least two transistors of a second stage comprising one of: a) the one or more cascode stages, and b) the input stage, per step (840); during a first mode of operation, providing a first conduction path between a first input RF signal of the plurality of input RF signals and the output stage, the first conduction path comprising the at least one cascode transistor of the first stage and one of the at least two transistors of the second stage, thereby amplifying the first input RF signal based on the first conduction path, per step (850); and during a second mode of operation, providing a second conduction path between a second input RF signal of the plurality of input RF signals and the output stage, the second conduction path comprising the at least one cascode transistor of the first stage and the other of the at least two transistors of the second stage, thereby amplifying the second input RF signal based on the second conduction path, per step (860).

Based on the above description, a person skilled in the art would realize that the multi-input cascode configurations described above may be used not only in reception paths of multi-band and/or multi-mode RF systems, but in any RF system where it is desired to amplify one or more RF signals according to different performance metrics.

Reduced layout size advantage provided by the configurations according to the present teachings may allow further reduction of a monolithically integrated circuit using such configurations. A person skilled in the art would realize that monolithic integration of any of the configurations described above, either in their entireties or partially, may be possible as well, depending on desired implementation goals.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments according to the present disclosure have been described. It is to be understood that various modifications may be made without departing from the spirit and scope of such embodiments. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the disclosure, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A multi-input cascode amplifier configuration comprising:
   an input stage comprising a plurality of input transistors configured to receive a plurality of input RF signals; and
   a plurality of cascode stages comprising an output stage, wherein the input transistors of the input stage and cascode transistors of the plurality of cascode stages are connected according to a tree structure so that at least one cascode transistor of a first cascode stage of the plurality of cascode stages is coupled to at least two cascode transistors of a second cascode stage of the plurality of cascode stages, and
   wherein the output stage comprises one or more cascode transistors, each cascode transistor of the one or more cascode transistors coupled via a drain of said cascode transistor to a supply voltage.

2. The multi-input cascode configuration according to claim 1, wherein:
   the input stage and the plurality of cascode stages are arranged in a sequence comprising the input stage as a bottom stage in the sequence, the output stage as a top stage in the sequence, and remaining stages of the plurality of cascode stages as one or more intermediate stages in the sequence, and
   the first cascode stage is arranged above the second cascode stage in the sequence.

3. The multi-input cascode configuration according to claim 2, wherein the first cascode stage is the output stage.

4. The multi-input cascode configuration according to claim 3, wherein the second cascode stage is a stage that is coupled to the input stage.

5. The multi-input cascode configuration according to claim 2, wherein the first cascode stage is different from the output stage.

6. The multi-input cascode configuration according to claim 5, wherein the second cascode stage is a stage that is coupled to the input stage.

7. The multi-input cascode configuration according to claim 1, wherein the at least one cascode transistor of the first cascode stage is connected, via a source node of said transistor, to respective drain nodes of the at least two cascode transistors.

8. The multi-input cascode configuration according to claim 1, wherein the at least one cascode transistor of the first cascode stage comprises two transistors, each of the two transistors coupled to at least two respective transistors of the second cascode stage.

9. The multi-input cascode configuration according to claim 1, wherein:
at least one cascode transistor of the second cascode stage is connected to at least two transistors of a third stage comprising one of: a) the plurality of cascode stages, and b) the input stage.

10. The multi-input cascode configuration according to claim 9, wherein the at least one cascode transistor of the second stage is one of the at least two transistors of the second cascode stage coupled to the at least one cascode transistor of the first cascode stage.

11. The multi-input cascode configuration according to claim 1, wherein:
during operation, the multi-input cascode configuration is configured to selectively provide, for each input transistor of the plurality of input transistors, a different conduction path between the each input transistor and a cascode transistor of the output stage according to a plurality of modes of operation comprising a first mode of operation and a second mode of operation,
during the first mode of operation, the different conduction path is a first conduction path that comprises one of the at least two transistors of the second cascode stage, and the at least one cascode transistor of the first cascode stage, and
during the second mode of operation, the different conduction path is a second conduction path that comprises the other of the at least two transistors of the second cascode stage, and the at least one cascode transistor of the first cascode stage.

12. The multi-input cascode configuration according to claim 11, wherein the different conduction path is selected based on:
activation of only one transistor of the plurality of transistors of the input stage,
activation of only one cascode transistor of each of the plurality of cascode stages, and
deactivation of remaining input transistors and remaining cascode transistors.

13. The multi-input cascode configuration according to claim 12, wherein the activation and deactivation is based on biasing voltages provided to gates of the input and cascode transistors.

14. The multi-input cascode configuration according to claim 11, wherein:
the plurality of modes of operation further comprises a third mode of operation that provides different conduction paths between two different input transistors of the plurality of input transistors of the input stage and the one or more cascode transistors of the output stage.

15. The multi-input cascode configuration according to claim 14, wherein the different conduction paths of the third mode of operation comprise the first conduction path and the second conduction path.

16. The multi-input cascode configuration according to claim 1, further comprising an inductor coupled at one end of the inductor, to at least two input transistors of the plurality of input transistors, and coupled at another end of the inductor, to a reference ground.

17. The multi-input cascode configuration according to claim 16, wherein the one end of the inductor is coupled to source nodes of the at least two input transistors.

18. A radio frequency (RF) circuital arrangement comprising a plurality of multi-input cascode configurations according to claim 1 arranged in parallel, comprising:
a common output node coupled to the output stage of each of the plurality of multi-input cascode configurations; and
a plurality of input nodes, each of the plurality of input nodes coupled to a respective input transistor of the plurality of input transistors of each of the plurality of multi-input cascode configurations,
wherein the plurality of input nodes are configured to receive the plurality of input RF signals, and
wherein the common output node is configured to provide an amplified version of an input RF signal of the plurality of input RF signals based on a selected mode of operation and a selected gain of the circuital arrangement.

19. The radio frequency (RF) circuital arrangement according to claim 18, wherein:
the selected gain is based on a number of multi-input cascode configurations of the plurality of multi-input cascode configurations that provide a current conduction path between the common output node and the amplified input RF, and
the selected mode is based on activated and deactivated transistors of the tree structure that provide the current conduction path, wherein a single transistor of each of the input stage and the one or more cascode stages of a respective multi-input cascode configuration is activated.

20. A method for amplifying a plurality of input RF signals according to at least two modes of operation, the method comprising:
providing an input stage comprising a plurality of input transistors configured to receive the plurality of input RF signals;
providing one or more cascode stages comprising an output stage;
connecting the input transistors of the input stage and cascode transistors of the one or more cascode stages;
based on the connecting, forming a tree structure so that at least one cascode transistor of a first cascode stage of the one or more cascode stages is coupled to at least two transistors of a second stage comprising one of: a) the one or more cascode stages, and b) the input stage;
during a first mode of operation, providing a first conduction path between a first input RF signal of the plurality of input RF signals and the output stage, the first conduction path comprising the at least one cascode transistor of the first stage and one of the at least two transistors of the second stage, thereby amplifying the first input RF signal based on the first conduction path; and
during a second mode of operation, providing a second conduction path between a second input RF signal of the plurality of input RF signals and the output stage, the second conduction path comprising the at least one cascode transistor of the first stage and the other of the at least two transistors of the second stage, thereby amplifying the second input RF signal based on the second conduction path.

21. A multi-input cascode amplifier configuration comprising:

an input stage comprising a plurality of input transistors configured to receive a plurality of input RF signals; and a plurality of cascode stages comprising an output stage, wherein the input stage and the plurality of cascode stages are arranged in a sequence comprising the input stage as a bottom stage in the sequence and the output stage as the top stage in the sequence so to provide a tree structure having a plurality of different conduction paths from the input stage to the output stage, wherein a number of cascode transistors of a first stage of the plurality of cascode stages is greater than a number of cascode transistors of a second stage of the plurality of cascode stages that is arranged immediately above the first stage, and wherein the output stage comprises one or more cascode transistors, each cascode transistor of the one or more cascode transistors coupled via a drain of said cascode transistor to a supply voltage.

* * * * *